United States Patent
Kondo et al.

(10) Patent No.: US 6,472,753 B2
(45) Date of Patent: Oct. 29, 2002

(54) BICMOS SEMICONDUCTOR INTEGRATED CIRCUIT DEVICE AND FABRICATION PROCESS THEREOF

(75) Inventors: Masao Kondo, Higashirurayama (JP); Katsuyoshi Washio, Tokorozawa (JP); Eiji Oue, Oume (JP); Hiromi Shimamoto, Iruma (JP)

(73) Assignees: Hitachi, Ltd., Tokyo (JP); Hitachi Device Engineering Co., Ltd., Chiba (JP)

( * ) Notice: Subject to any disclaimer, the term of this patent is extended or adjusted under 35 U.S.C. 154(b) by 0 days.

(21) Appl. No.: 09/811,478

(22) Filed: Mar. 20, 2001

(65) Prior Publication Data

US 2002/0053737 A1 May 9, 2002

Related U.S. Application Data

(63) Continuation of application No. 09/808,952, filed on Mar. 16, 2001.

(30) Foreign Application Priority Data

Nov. 7, 2000 (JP) ......................................... 2000-338821

(51) Int. Cl.[7] .............................................. H01L 23/48
(52) U.S. Cl. ........................ 257/758; 257/587; 257/588; 437/31
(58) Field of Search ................................. 257/559, 587, 257/588, 592, 593, 910; 437/61, 63, 909

(56) References Cited

U.S. PATENT DOCUMENTS

| | | | | |
|---|---|---|---|---|
| 4,908,328 A | * | 3/1990 | Hu et al. | |
| 5,316,957 A | * | 5/1994 | Spratt et al. | ................... 437/31 |
| 5,399,507 A | * | 3/1995 | Sun | |
| 5,430,318 A | * | 7/1995 | Hsu | |
| 5,484,738 A | * | 1/1996 | Chu et al. | |
| 5,952,706 A | * | 9/1999 | Bashir | ......................... 257/587 |

FOREIGN PATENT DOCUMENTS

| | | | |
|---|---|---|---|
| JP | 6-310665 | * | 11/1994 |
| JP | 7-99259 | * | 4/1995 |

OTHER PUBLICATIONS

IEEE Transactions on Electron Devices, vol. 41, No. 9, Aug. 1994, pp. 1379–1387.*

* cited by examiner

*Primary Examiner*—David Nelms
*Assistant Examiner*—Mai-Huong Tran
(74) *Attorney, Agent, or Firm*—Mattingly, Stanger & Malur, P.C.

(57) ABSTRACT

Provided is a BiCOMOS semiconductor integrated circuit device which comprises a semiconductor substrate having an insulating layer internally and partially embedded therein and a semiconductor layer deposited on the insulating layer, an insulated gate type transistor formed in the semiconductor layer, a highly-doped collector layer of a bipolar transistor embedded in an insulating-layer-free portion of the semiconductor substrate, and a low-doped collector layer disposed on the highly-doped collector layer of the bipolar transistor, wherein the height level of the lower portion of the low-doped collector layer is below the height level of the lower portion of the insulating layer so as to attain high breakdown voltage and high speed operation of the bipolar transistor.

3 Claims, 23 Drawing Sheets

BICMOS SEMICONDUCTOR INTEGRATED CIRCUIT DEVICE AND FABRICATION PROCESS THEREOF

This is a continuation application of U.S. Ser. No. 09/808,952, filed Mar. 16, 2001.

BACKGROUND OF THE INVENTION

1. Field of the Invention

The present invention relates to a BiCMOS (having both bipolar and CMOS) integrated circuit device and a fabrication process thereof. In particular, the invention relates to a BiCMOS device including both a CMOSFET region having an SOI (Silicon on Insulator) structure and a bipolar transistor region having a bulk structure, which device is used for LSI for high-speed optical network systems, or LSI for broadband wireless systems and is suited for high speed operation; and a fabrication process of the device.

2. Description of the Related Art

A BiCMOS device which has both an SOI structure region and a bulk structure region (free of an SOI layer) and has a MOS transistor formed in the SOI structure region and a vertical bipolar transistor in the bulk structure region is described in FIG. 4 on page 1382 of "IEEE Transaction on Electron Devices, Vol. 41, No. 8, pp 1379 to 1387(1994)" (which will be hereinafter called "first prior art").

This first prior art is characterized in that selective epitaxial growth (SEG) and planarizing polishing are conducted, each twice. By the first selective epitaxial growth and first planarizing polishing, the collector region of the bipolar transistor and i-type bulk substrate region for the SOI structure are formed. An n$^+$type collector region is formed by selective diffusion of high-concentration impurities into this collector region. By the second selective epitaxial growth and second planarizing polishing, the n-type collector region of the bipolar transistor and an SOI region are formed. By the formation of p type base region and n type emitter region in this n$^-$type collector region, an npn bipolar transistor is formed, while MOSFET is formed in the SOI region.

In addition, a BICMOS technique using an SOI region is disclosed, for example, in U.S. Pat. No. 5,484,738 (second prior art), Japanese Patent Application Laid-Open No. Hei 6-310665 (third prior art), or Japanese Patent Application Laid-Open No. Hei 7-99259 (fourth prior art), while an IC device using SOI is disclosed, for example, in U.S. Pat. No. 5,399,507; (fifth prior art) or U.S. Pat. No. 4,908,328 (sixth prior art). Among them, in the third, fourth and fifth prior arts, a so called SIMOX (separation by implantation of oxygen) technique of forming an SOI region by oxygen ion implantation inside of a semiconductor substrate is employed.

A schematic longitudinal cross-sectional view of the BiCMOS device which was investigated on trial by the present inventors based on the first prior art is shown in FIG. 7. In this diagram, only an npn type vertical bipolar transistor and an n channel insulated gate type transistor (which will hereinafter be called "MOS transistor") are illustrated and a p channel MOS transistor is omitted. In addition, not closely related portions upon comparison with the invention product are omitted.

In FIG. 7, indicated at reference numeral 1 is a p type Si substrate, 2 an SiO$_2$ layer, 3 a p type SOI layer, 4 an n$^+$ type Si layer, 5 a low-doped n type Si layer, 6I,7, each an SiO$_2$ film, 8 an n$^+$ type Si layer, 9 an SiO$_2$ film, 10 an n$^+$ type polycrystalline Si film, 11 an SiO$_2$ film, 12 an n$^+$ type SOI layer, 15 a P$^+$ type polycrystalline Si film, 16,17, each an SiO$_2$ film, 18 a p type Si layer, 181 a P$^+$ type Si layer, 20 an n$^+$ type polycrystalline Si film, 21 an n$^+$ type Si layer, 23 an SiO$_2$ film, 24 a metal plug, and 25 to 29, each a metal film. Indicated at reference numeral 4 is a buried n$^+$ type collector layer for the collector, 5 a low-doped n$^+$ type collector layer, 18 a base layer, and 21 an emitter diffusion layer of a bipolar transistor. Reference numeral 12 indicates source/drain diffusion layers of an MOS transistor. Among the metal electrodes, that indicated at reference numeral 25 serves as a base electrode, 26 an emitter electrode and 27 a collector electrode of the bipolar transistor, and 28 a source electrode and 29 a drain electrode of the MOS transistor.

The buried collector layer 4 of a bipolar transistor is formed at an equal surface level to the bulk substrate (SOI-layer supporting substrate) of an SOI structure. In other words, the upper surface of the buried collector layer 4, that is, the lower portion (which will also be called "lower surface" or "bottom portion") of the low-doped collector layer 5 is at a substantially equal level to the lower portion (lower surface or bottom surface) of the buried silicon oxide layer (BOX layer) 2. Here, the boundary between the buried collector layer 4 and the low-doped collector layer 5 is defined as to located at a position having an impurity concentration by about one figure lower than the peak of the impurity concentration of the buried collector layer 4, for example, a position having an impurity concentration of $3 \times 10^{18}$ cm$^{-3}$. The height level of the surface of the Si substrate in the bulk structure region (that is, the surfaces of the emitter layer 21 and base lead-out layer 181) is at an equal level to the upper surface of the SOI layer 3 and thus, the whole substrate surface is planarized. In this bulk structure region, the low-doped collector layer 5, base layer 18, base lead-out layer 181 and emitter layer 21 of a bipolar transistor are disposed in the height level between the lower portion (lower surface, bottom surface) of the BOX layer 2 and the upper surface of the SOI layer 3.

FIG. 9 schematically illustrates the positional relationship, in the investigated example illustrated in FIG. 7, among the surface of the SOI layer (its height position is indicated at letter A), the surface of the bulk structure region (B), the lower surface of the BOX layer (C) and the upper surface (D) and lower surface (E) of the low-doped collector layer of the bipolar transistor and the height position A of the surface of the SOI layer is equal to the height position B of the surface of the bulk structure region, while the height position E of the lower surface of the low-doped collector layer is substantially equal to the height position C of the lower surface of the BOX layer. Accordingly, the difference (B–E) between the height position B of the surface of the bulk structure region and the height position E of the lower surface of the low-doped collector layer is substantially equal to the total thickness (A–C) of the SOI layer and BOX layer. In this example, (A–C) is set at 0.5 μm (micrometer) and the depth of the base diffusion layer is set at about 0.1 μm (micrometer), resulting in the thickness (D–E) of the low-doped collector layer of about 0.4 μm (micrometer).

Another process for fabricating the integrated circuit device structure as illustrated in FIG. 7 or FIG. 9 is proposed. Described specifically, this process comprises disposing a BOX layer and an SOI layer over the principal surface of a Si semiconductor substrate in advance (preparing an SOI wafer), partially removing the SOI layer and BOX layer from a region wherein a bipolar transistor is to be formed, forming an n type collector layer over the surface of the bulk Si substrate by ion implantation or heat diffusion, thereby forming a buried collector layer 4, subjecting non-doped or n⁻type Si single crystals to selective epitaxial growth with the n⁺ type collector layer as a seed, shaving the surface of the Si single crystals in the-bulk structure region by polishing to make its height equal to the surface height of the SOI layer and then forming base and emitter layers on the surface of the bulk structure region. This process is convenient for mass production because a thin SOI layer is formed in advance so that its thickness or properties can be controlled easily.

In order to attain speed increase and reduction in a power consumption amount of the MOS transistor on the SOI layer, it is desired to form the SOI layer with a markedly thin thickness, to be 0.15 μm (micrometer) or less, more desirably to be about 0.05 μm (micrometer). Such a thin film makes it possible to reduce the capacitance of the depletion layer below the gate electrode. In particular, to operate the MOSFET formed on the SOI layer under fully depleted conditions, the SOI layer is desired to be as thin as 0.05 μm (micrometer) or less.

The above-described SIMOX process is a promising for the formation of this markedly thin SOI layer at a low cost with high precision. As a result of an experiment by the present inventors to make, on trial, an SOI structure by the SIMOX technique, however, it was found that the thinning of the SOI layer is accompanied by the thinning of the BOX layer there below. For example, an attempt to form the SOI layer (Si layer) as thin as 0.15 μm (micrometer) or less tends to lead to the formation of the BOX film ($SiO_2$ film) having a thickness of 0.2 μm (micrometer) or less. It was found that in most cases, the total thickness of the (SOI layer+BOX layer), that is, the above described (A–C) in FIG. 9, becomes 0.35 μm (micrometer) or less.

Formation of a BICMOS device having a structure as illustrated in FIG. 7 by decreasing the thickness of the (SOI layer+BOX layer) through the SIMOX technique, therefore inevitably leads to a structure as illustrated in FIG. 8. The positional relationship of A to E in this case is illustrated schematically in FIG. 10. The base diffusion layer 18 has a depth of about 0.1 μm (micrometer) or greater. When the relative positional relationship of the height positions A to E is set equal to that of FIG. 7 or FIG. 9, that is, the thickness [A–C] is set 0.35 μm or less, then the thickness [B–E] is about equal to the thickness [A–C], the thickness (D–E) of the low-doped collector layer 5 becomes 0.25 μm (micrometer) or less. Such a decrease in thickness of the low-doped collector layer 5 brings about an increase in the maximum cut-off frequency (fT) of the transistor but increases its parasitic capacitance. When the low-doped collector layer is thinned even to 0.25 μm (micrometer), it is thought effective to increase an impurity concentration of the low-doped collector layer in the transistor intrinsic region by implantation of impurity ions in order to improve fT further while suppressing an increase in the parasitic capacitance to the minimum. A further decrease in the thickness of the low-doped collector layer is not desired, because it drastically heightens parasitic capacitance but its fT improving effect is small. If the (SOI layer+BOX layer) is reduced further to 0.2 μm (micrometer) and the thickness of the low-doped collector layer is set at 0.1 μm (micrometer) or less, breakdown voltage ($BV_{CE}$) between the emitter and the collector becomes less than 2 V and the parasitic capacitance between base and collector exceeds 1.5 times of the permissible upper limit.

When a bipolar transistor is formed in the bulk structure region in the SOI structure formed by SIMOX, it therefore becomes difficult to attain good transistor properties in the structure as illustrated in FIG. 8, that is, in the structure wherein the relationship of the height positions A to E is equal to that of FIG. 10.

A second problem occurs when the fundamental structure of FIG. 7 is fabricated using an SOI formed by SIMOX technique. As illustrated in FIG. 7, the insulating film which is in contact with the active area of the bipolar transistor in the surrounding form lies between the height position A of the surface of the SOI layer and the height position C of the surface of the bulk substrate in the SOI structure region and its thickness is almost equal to the total thickness of the (SOI layer and BOX layer). As described above, when the SIMOX technique is employed, the total thickness of the (SOI layer+BOX layer) becomes 0.35 μm (micrometer) or less in most cases, resulting in that the insulating film inevitably has similar thickness as illustrated in FIG. 10. The insulating film at this site is desired to have a thickness of at least 0.4 μm (micrometer). A decrease in the film thickness causes a problem such as an increase in the parasitic capacitance between base and emitter. For example, the parasitic capacitance between the base lead-out electrode 15 which occupies relatively a large area and the n⁺ collector layer 4 tends to increase, resulting in a deterioration in the high frequency properties of the bipolar transistor.

As can be understood from the above description, it is difficult to integrate, on one semiconductor substrate, an MOSFET constituted in an SOI layer of 0.15 μm (micrometer) or less thick which has been formed by the SIMOX technique and a vertical bipolar transistor having an emitter-collector breakdown voltage ($BV_{CE}$) of at least 2 V.

SUMMARY OF THE INVENTION

An object of the present invention is therefore to provide a BiCMOS (having both bipolar and CMOS) device which has both a MOSFET region of an SOI structure (Silicon on Insulator) and a bipolar transistor region of a bulk structure and is suited for high-speed operation.

Another object of the present invention is to provide a low-cost fabrication process of a BiCMOS device wherein a bipolar transistor is formed in a bulk structure region in an SOI structure formed using SIMOX, which process can overcome the above-described problems.

A further specific object of the present invention is to provide an improved BiCMOS device, which has both a CMOSFET region of an SOI (Silicon on Insulator) structure and a vertical bipolar transistor region of a bulk structure, to be used for an LSI for high-speed optical network systems or LSI for broadband wireless systems and suited for high-speed operation.

The above-described problem occurs because all of n⁻type low-doped collector, base and emitter are formed in the thickness of (SOI layer+BOX layer) as illustrated in FIGS. 8 and 10. This problem can be overcome by disposing or positioning the height position E of the lower surface of the low-doped collector below the height position C of the lower surface of the BOX layer or disposing or positioning the height position D of the upper surface of the low-doped collector layer at a position exceeding the height position C by 0.25 μm (micrometer) or more. A device structure and fabrication process thereof which can carry out such disposal at a low cost will next be described.

In one aspect of the present invention, there is thus provided a BICOMOS semiconductor integrated circuit device comprising a semiconductor substrate having an insulating layer internally and partially embedded therein and a plurality of semiconductor layers disposed on or over said insulating layer, an n channel insulated gate type transistor and a p channel insulated gate type transistor each formed in said plurality of semiconductor layers, a highly-doped collector layer embedded in a said-insulating-layer-free portion of said semiconductor substrate, and a low-doped collector layer disposed on or in said highly-doped collector layer, wherein the height level of the lower portion of the low-doped collector layer is below the height level of the lower portion of said insulating layer.

In another aspect of the present invention, there is also provided a BICMOS semiconductor integrated circuit device comprising a semiconductor substrate having an insulating layer internally and partially embedded therein and a plurality of semiconductor layers deposited on said insulating layer, an n channel insulated gate type transistor and a p channel insulated gate-type transistor each formed in said plurality of semiconductor layers, a highly-doped collector layer formed by doping impurities on a said-insulating-layer-free portion of the surface of said semiconductor substrate, a low-doped collector layer deposited over said highly-doped collector layer at a substantially equal level to that of the height of the upper surface of the semiconductor layer and a base layer deposited on the upper surface of the low-doped collector layer.

In a further aspect of the present invention, there is also provided a BICMOS semiconductor integrated circuit device, comprising a semiconductor substrate having an insulating layer internally and partially embedded therein and a plurality of semiconductor layers deposited on said insulating layer, an n channel insulated gate type transistor and a p channel insulated gate type transistor each formed in said plurality of semiconductor layers, a highly-doped collector layer formed by doping impurities on a said-insulating-layer-free portion of the surface of said semiconductor substrate, and a low-doped collector layer deposited on said highly-doped collector layer to have a height level higher than the height level of the upper surface of said semiconductor layer.

In a still further aspect of the present invention, there is also provided a BICMOS semiconductor integrated circuit device comprising a semiconductor substrate having an insulating layer internally and partially embedded therein and a plurality of semiconductor layers deposited on said insulating layer, an n channel insulated gate type transistor and a p channel insulated gate type transistor each formed in said plurality of semiconductor layers, a highly-doped collector layer of a vertical bipolar transistor formed in a said-insulating-layer-free portion of said semiconductor substrate, a low-doped collector layer deposited on said highly-doped collector layer and base and emitter layers each formed at an upper surface portion of said low-doped collector layer, wherein the thickness of said low-doped collector layer between said base layer and said highly-doped collector layer is not less than the total thickness of said insulating layer and said semiconductor layer.

In a still further aspect of the present invention, there is also provided a BICMOS semiconductor integrated circuit device comprising a buried insulating layer partially disposed on a semiconductor region, a plurality of semiconductor layers deposited on said insulating layer and having a thickness not greater than 0.15 $\mu$m (micrometer), a plurality of n type and p type insulated gate type transistors formed in said semiconductor layer, and a vertical bipolar transistor which has a highly-doped collector layer formed in a said-insulating-layer free portion of said semiconductor region, a low-doped collector layer disposed above said highly-doped collector layer, and base layer and emitter layer each disposed at the upper surface portion of said low-doped collector layer, and has a collector-emitter breakdown voltage of 2 V or greater.

In a still further aspect of the present invention, there is also provided a process for fabricating a BICMOS semiconductor integrated circuit device, which comprises preparing a semiconductor wafer having an insulating layer embedded in a semiconductor region and a semiconductor layer deposited on said insulating layer, partially removing said semiconductor layer and said insulating layer there below to expose said semiconductor region below said insulating layer, forming a highly-doped collector layer of a vertical bipolar transistor by ion implantation inside of said exposed semiconductor region, forming at least a part of a low-doped collector layer at a site both inside of said semiconductor and on said highly-doped collector layer, and forming a base layer and an emitter layer at the surface portion of said collector layer.

In a high-speed BiCMOS integrated circuit device having, formed thereon, an MOS transistor in the SOI layer of the SOI wafer and a vertical bipolar transistor on the bulk region, it is preferred to adjust the total thickness of the (SOI layer+BOX layer) to 0.35 $\mu$m (micrometer) or less and, in particular, the thickness of the SOI layer to 0.15 $\mu$m (micrometer) or less in order to increase the speed of the MOS transistor and reduce the consumption amount of power. The present invention makes it possible to maintain the $BV_{CE}$ breakdown voltage of the bipolar transistor at 2 V or greater and suppress the parasitic capacitance between base and collector as small as possible even at such a thin thickness, and moreover to reduce the production cost of the BiCMOS integrated circuit device having such excellent properties.

DETAILED DESCRIPTION OF THE PREFERRED EMBODIMENTS

The various features relating to the present invention will next be described more specifically based on some schematic views.

Figure 11:
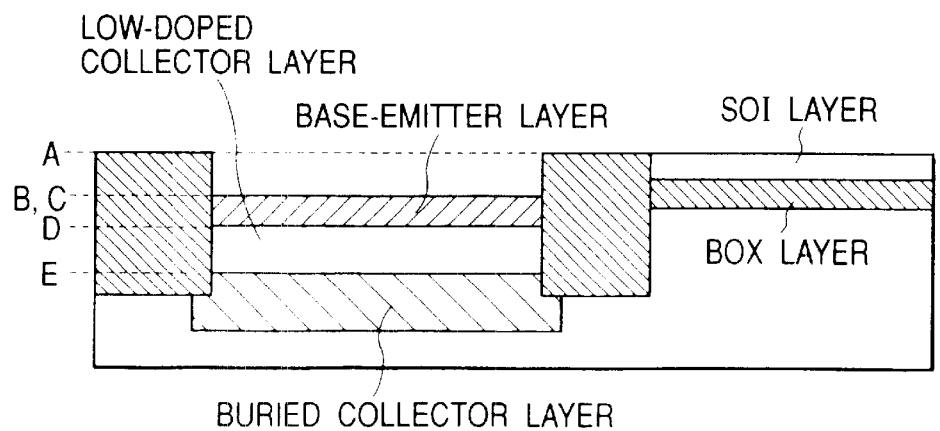
FIG. 11 is a schematic cross-sectional view illustrating the BiCMOS device according to Embodiment 1 of the present invention.
Figure 12:
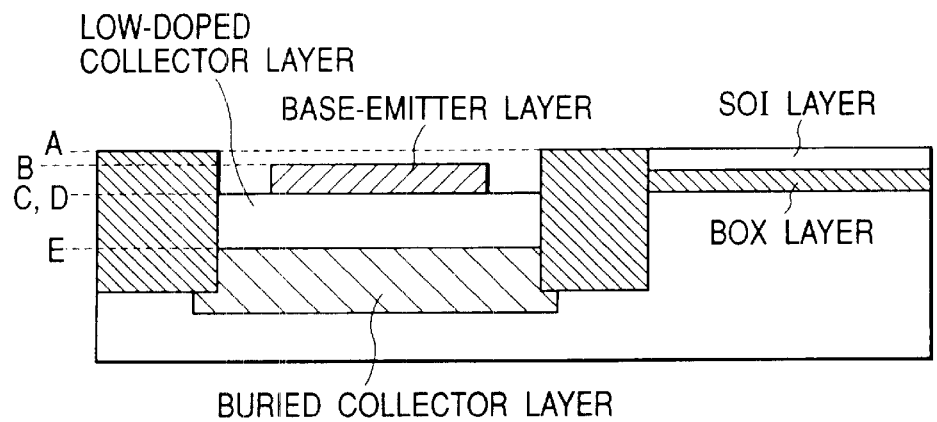
FIG. 12 is a schematic cross-sectional view illustrating the BiCMOS device according to Embodiment 2 of the present invention.

In the first invention, as illustrated schematically in FIG. 11 or 12, a device is formed to have a structure wherein the height position or level D of the upper surface of the low-doped collector layer is at a substantially equal level or lower level relative to the lower surface C of the BOX layer (insulating layer) and the height position or level E of the lower surface of the low-doped collector layer is by at least 0.25 $\mu$m (micrometer) lower than the height position D.

Specifically, a buried $n^+$ collector layer and an $^-$low-doped collector layer are formed by the following process. The buried $n^+$ collector layer is formed by preparing an SOI wafer, which has thereon an $SiO_2$ (BOX) layer formed by implanting oxygen ions inside of the Si region (bulk Si substrate) having a low impurity concentration and has, over this $SiO_2$ layer, a thin Si layer (SOI layer) remained; selectively removing the SOI layer and BOX film from a region in which a bipolar transistor is to be formed, thereby exposing the surface of the bulk Si substrate; and selectively implanting n type impurities in the bulk Si substrate by photolithography and high-energy ion implantation at an accelerating energy of several hundreds KeV or greater. A portion sandwiched between this buried $n^+$ collector layer and the surface of the bulk Si substrate will be a low-doped collector layer so that an epitaxial growth step which is otherwise required for the formation of this layer becomes unnecessary. The accelerating energy of ion implantation is adjusted so that the distance from the surface of the bulk Si substrate to the upper surface of the buried collector layer, that is, the lower surface of the low-doped collector layer will be a desired value not less than 0.35 $\mu$m (micrometer). The base and emitter layers are formed by diffusing impurities in this low-doped collector region.

Alternatively, on the low-doped collector region, epitaxial growth of base and emitter layers can be carried out as illustrated in FIG. 12. In this case, the base layer can be formed thin at a high impurity concentration. Since the low-doped collector layer is not invaded by the base and emitter layers, 0.25 $\mu$m (micrometer) or greater is sufficient as a distance from the surface of the bulk Si substrate to the lower surface of the low-doped collector layer. A vertical bipolar transistor which has a larger current amplification factor and can be operated at a higher speed can be formed by growing an SiGe alloy on the low-doped collector layer, to form the base layer, and then growing Si there-on to form the emitter layer.

Figure 13:
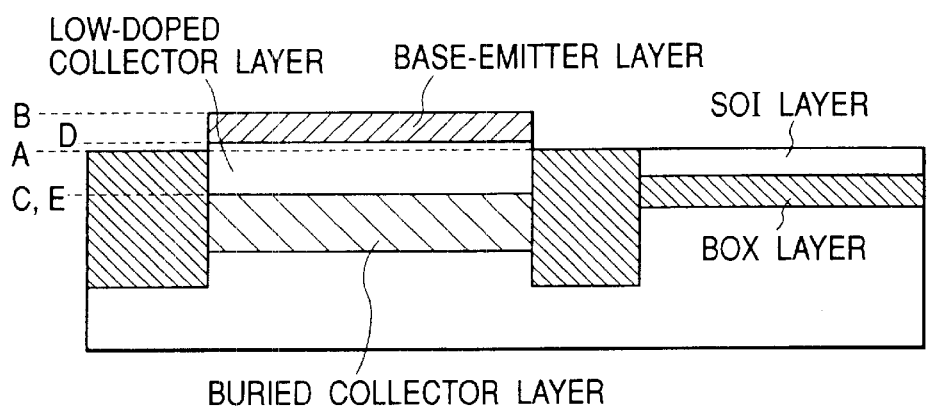
FIG. 13 is a schematic cross-sectional view illustrating the BiCMOS device according to Embodiment 4 of the present invention.

In the second invention, as illustrated schematically in FIG. 13, a device is formed to have a structure wherein although the height position or level E of the lower surface of the low-doped collector layer is at a substantially equal level to that C of the lower surface of the BOX layer, the height position B of the surface of the substrate in the bulk structure region is above the height position A of the surface of the SOI layer.

Specifically, such a structure is actualized in the following manner. After removal of the SOI layer and BOX film from a region in which a bipolar transistor is to be formed in a similar manner to that for the first invention, $n^+$ type impurity layer is formed on the surface of the bulk Si substrate by ion implantation or thermal diffusion. This impurity layer will be a buried collector layer. Then, with this $n^+$ type impurity layer as a seed, non-doped or $n^-$type Si single crystals are formed by selective epitaxial growth. The surface of the Si single crystals in the bulk structure region is then shaved by polishing so that its surface height will become higher by at least 0.1 μm (micrometer) than the surface of the SOI layer. On the surface of the bulk structure region, base and emitter layers are then formed. This process makes it possible to form the low-doped collector layer to have a thickness of 0.25 μm or greater.

In the above-described process, however, shaving of the surface of the Si single crystals in the bulk structure region but leaving, without shaving, a predetermined-width portion to be higher than the surface of the SOI layer deteriorates the flatness of the wafer surface, leading to a disadvantage that the steps subsequent thereto become complex. The below-described process is another measure for avoiding this problem. As illustrated schematically in FIG. 14, the total thickness of the (SOI layer+BOX layer) is adjusted to 0.25 μm (micrometer) or greater and the bulk structure region is shaved to make the surface height of the Si single crystals equal to the surface height of the SOI layer. On at least a portion of the bulk structure region, that is, the low-doped collector region, base and emitter layers are formed by epitaxial growth. Since the formation of these base and emitter layers is conducted after completion of the formation of an element isolation structure, that is, the main portion of the MOS transistor which requires flatness of the wafer, the above-described problem caused by deterioration in the flatness of the wafer does not occur in this process.

In the third invention, as illustrated schematically in FIGS. 15 and 16, a device is formed to have a structure wherein the height position D of the upper surface of the low-doped collector layer is disposed above the lower surface C of the BOX layer and the height position E of the lower surface of the low-doped collector layer is disposed below the lower surface C of the BOX layer and at the same time lower by at least 0.25 μm (micrometer) below the height D.

Specifically, a buried collector layer and a low-doped collector layer are formed in the below-described manner. First, n$^+$ type buried collector layer is formed by removing the SOI layer and BOX film in a similar manner to that in the first process, and then selectively implanting impurities in the bulk Si substrate of this region by photolithography and high-energy ion implantation method at an accelerating energy of several hundreds kev or greater. Then, in a similar manner to the second process, non-doped or n type Si single crystals are epitaxially grown thinly in this region and then the surface of Si single crystals in the bulk structure region is shaved and planarized by polishing. Then, in a similar manner to the second process, base and emitter layers are formed in the bulk structure region by diffusion or epitaxial growth. In this case, the low-doped collector layer is a laminate of a portion on the buried collector layer of the bulk Si substrate and non-doped or n$^-$type Si single crystal layer obtained by epitaxial growth.

The above-described first or third process facilitates circuit designing of LSI, because plural types of transistors different in the depth of the buried impurity layer can be formed on the same substrate by changing, according to the transistor, the ion implantation energy for the formation of the buried collector layer.

It is also possible to form two transistors by the second process and third process, respectively, on the same substrate.

Figure 8:
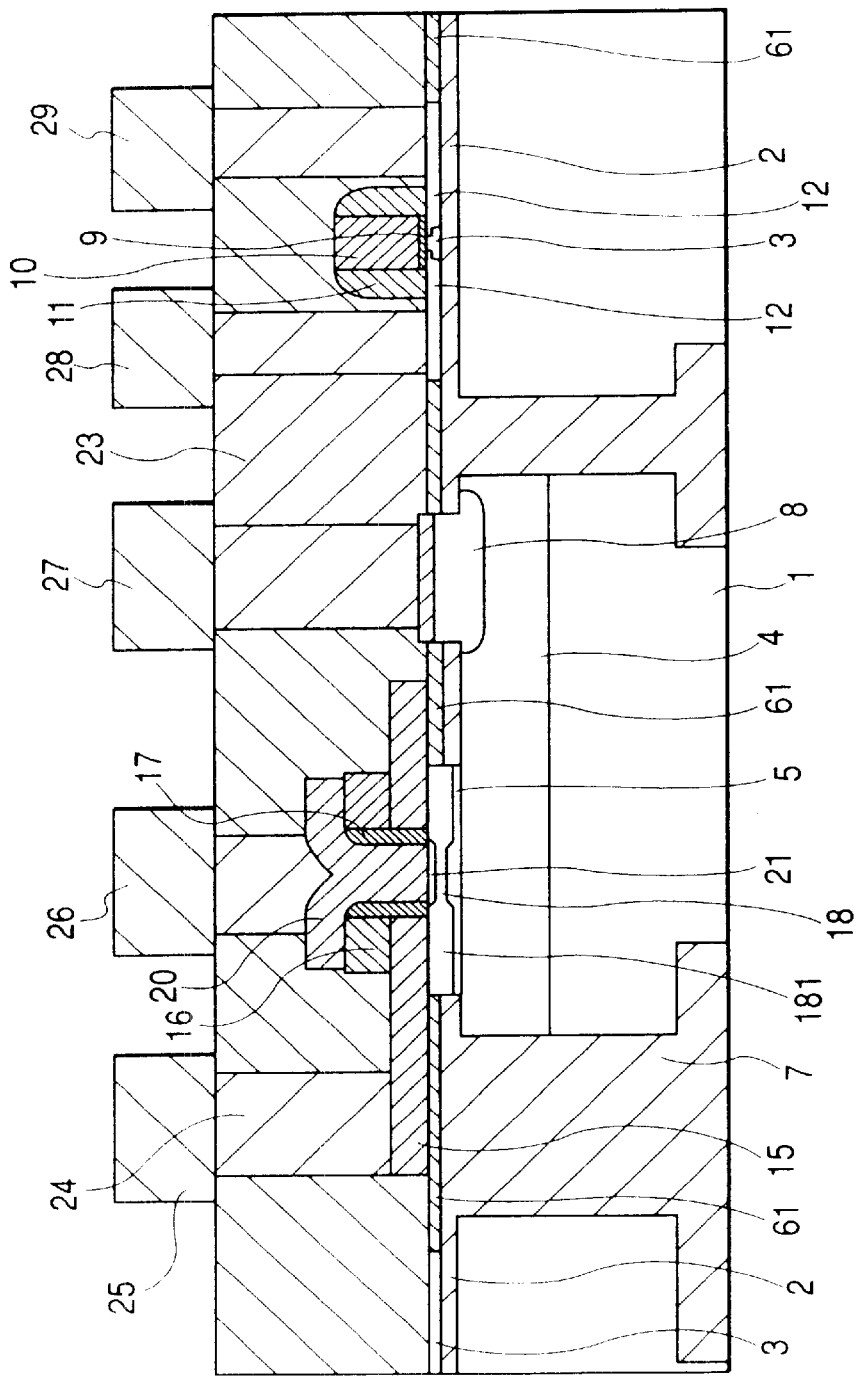
FIG. 8 is a cross-sectional view of a BiCMOS device for further describing a problem to be solved by the present invention.
Figure 9:
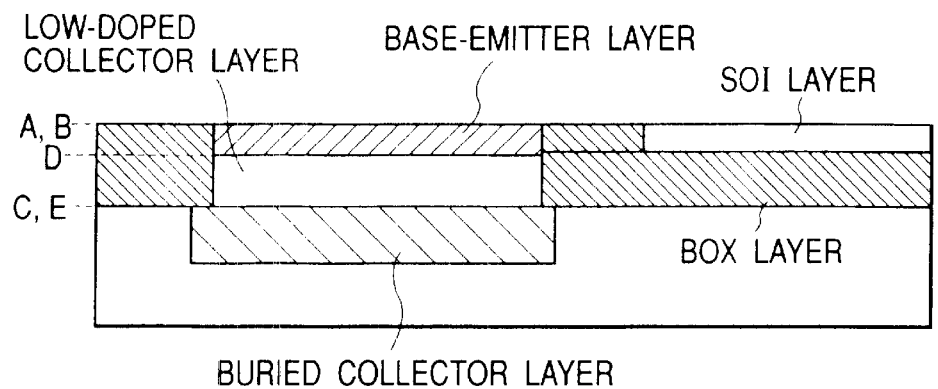
FIG. 9 is a schematic cross-sectional view illustrating a BiCMOS device which corresponds to FIG. 7 for describing the problem to be solved by the present invention.
Figure 10:
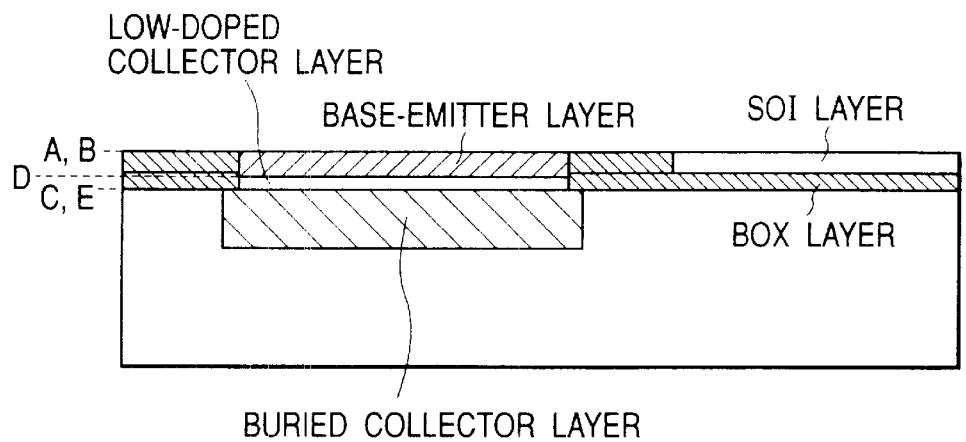
FIG. 10 is a schematic cross-sectional view illustrating a BiCMOS device which corresponds to FIG. 8 for describing the problem to be solved by the present invention.

A description will next be made of a method for overcoming the above-described second problem, that is, the problem relating to an insulating film which is in contact with the active area of a bipolar transistor in the surrounding form. The insulating film which is in contact with the active area, particularly the base layer, of the bipolar transistor in the surrounding. form lies between the height position A of the surface of the SOI layer and the height position C of the lower surface of the BOX layer in the device as illustrated in FIG. 8 or 10. In order to increase the thickness of the insulating film without impairing the flatness of the wafer surface, it is recommended to dispose the lower surface of the insulating film below the height position C, as illustrated in FIGS. 11 to 16. Alternatively, an insulating film having such a structure may also be formed in the SOI structure region for the element isolation of the MOS transistor. The specific formation process of this insulating film is as follows.

The SOI layer and buried oxide film are selectively removed from a specific region of the SOI substrate to form an SOI having region and an SOI-free region. Trenches are then formed by cutting the bulk Si substrate at the periphery of the active area (for example, base layer) downwards from the surface height of the base layer of the vertical type bipolar transistor. An SiO$_2$ film is filled in each of the trenches, followed by polishing of the wafer surface to remove a portion of the SiO$_2$ film outside each of the trenches. A base electrode interconnection is disposed to extend over the SiO$_2$ film thus filled. In order to make similar trenches in the SOI region simultaneously, it is recommended to remove portions of the SOI layer and buried oxide film, which will be trenches, at the same time with digging of the trenches in the bulk structure region, followed by digging of the bulk Si substrate therebelow. After these trenches are filled with an SiO$_2$ film, a portion of the SiO$_2$ film outside these trenches is removed by polishing.

The present invention enables coexistence of a vertical bipolar transistor having a high breakdown voltage and low parasitic capacitance and an SOIMOSFET, thereby facilitating high-density integration in one SOI wafer even if the (SOI layer+BOX layer) is as thin as 0.35 μm (micrometer) or less or the SOI layer is as thin as 0.15 μm (micrometer) or less.

EMBODIMENTS

Embodiment 1

Figure 1:
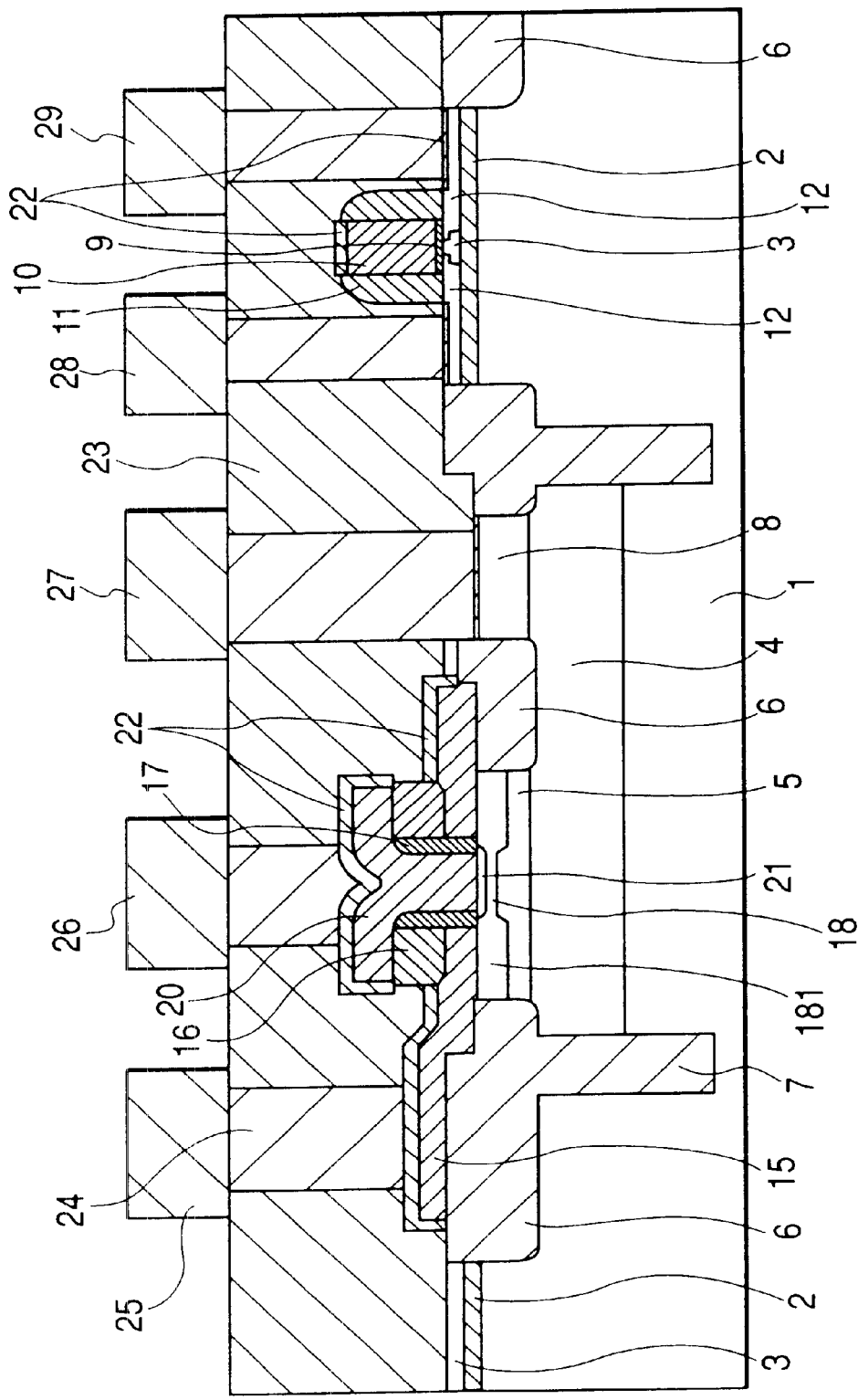
FIG. 1 is a cross-sectional view illustrating a BiCMOS device according to Embodiment 1 of the present invention.

The first embodiment of the present invention will next be described based on FIG. 1. FIG. 1 illustrates a longitudinal cross-sectional structure of the BiCMOS device according to the first embodiment of the present invention.

In FIG. 1, indicated at reference numeral 1 is a p type Si substrate, 2 an SiO$_2$ layer, 3 a P$^-$type SOI layer, 4 an n$^+$ type Si layer, 5 a low-doped n$^-$type Si layer, 6 and 7, each an SiO$_2$ film, 8 an n$^+$ type Si layer, 9 an SiO$_2$ film, 10, an n$^+$ type polycrystalline Si film, 11 an SiO$_2$ film, 12 an n$^+$ type SOI layer, 15 a P$^+$ type polycrystalline Si film, 16 and 17 each an SiO$_2$ film, 18 a p type Si layer, 181 a P$^+$ type Si layer, 20 an n$^+$ type polycrystalline Si film, 21 an n$^+$ type Si layer, 22 a silicide film, 23 an SiO$_2$ film, 24 a metal plug, and 25 to 29 each a metal film. Among them, the layer indicated at reference numeral 4 serves as a buried n$^+$ collector layer, 5 a low doped n$^-$collector layer, 18 a p type base layer, and 181 a P$^+$ lead-out layer for a base electrode, and 21 an n type emitter diffusion layer, each of a bipolar transistor, and 12 as source/drain diffusion layers of the MOS transistor. Among the metal electrodes, 25 serves as a base electrode, 26 as an emitter electrode, and 27 as a collector electrode, each of the bipolar transistor, and 28 a source electrode and 29 as a drain electrode, each of an MOS transistor. In this diagram, only npn type vertical bipolar transistor and n type MOS transistor are illustrated and a p type MOS transistor is omitted. The vertical bipolar transistor may be a pnp type.

In this Embodiment 1, the positional relationship among the surface (height position A) of the SOI layer, surface (B) of the bulk structure region, the lower surface (C) of the BOX layer and the upper surface (D) and the lower surface (E) of the low-doped collector layer of the bipolar transistor is equal to that schematically illustrated in FIG. 11. Described specifically, the height position (B) of the surface of the bulk structure region is equal to the lower surface (C) of the BOX layer. The upper surface (D) and lower surface (E) of the low-doped collector layer 5 are disposed about 0.1 μm and about 0.4 μm below the height position (C) of the lower surface of the BOX layer, respectively and the thickness of the low-doped collector layer 5 is therefore about 0.3 μm. The total thickness of the (BOX layer+SOI layer) is 0.2 μm.

In this Embodiment 1, the height position of the lower surface of the insulating film which is in contact with the active area of the bipolar transistor in the surrounding form is lower than the height position C of the lower surface of the BOX layer. For element isolation of the MOS transistor, an insulating film of such a structure is formed in the SOI structure region.

In the next place, a process for fabricating the BiCMOS device of this Embodiment 1 will be described based on FIGS. 17(*a*) to 17(*e*), FIGS. 18(*a*) to 18(*d*) and FIGS. 19(*a*) and 19(*b*). They are the longitudinal cross-sectional views illustrating respective main steps for the fabrication of a vertical npn bipolar transistor and n type MOS transistor.

First, a buried $SiO_2$ film (BOX layer) 2 and SOI layer 3 are formed over a p type bulk Si substrate 1 by the SIMOX method (an SOI wafer is prepared). In this case, implantation conditions of oxygen ions are set so that the total thickness of the (BOX layer and SOI layer) will be 0.2 μm. By photolithography, dry etching and wet etching, the BOX layer 2 and SOI layer 3 are selectively removed from a region in which the bipolar transistor is to be formed. While the SOI structure region is covered with a photoresist film 101 of 2 μm thick, phosphorus ions ($P^+$) are implanted at a high concentration in the bulk Si substrate at an accelerating energy of 500 keV. Moreover, a small amount of phosphorus ions are implanted into the same region with an accelerating energy of 100 keV (as this ion implantation is conducted to convert the p type region to n type one implantation of only a small amount of ions is required and this separate implantation may be omitted because it can be conducted simultaneously upon the above-described high-concentration ion implantation). Then, phosphorous ions are selectively implanted at a high concentration. with an accelerating energy of 100 keV so that they are brought into contact with a portion of the region to which phosphorous ions have been implanted at a high concentration to form $n^+$ type silicon layer 8. By heating, the buried $n^+$ type Si collector layer 4, $n^-$type Si collector layer 5 and $n^+$ type Si collector lead-out layer 8 are formed by activating impurities added therein. (FIG. 17(*a*)).

After removal of the photoresist film 101, an $SiO_2$ film 102, polycrystalline Si film 103 and $SiO_2$ film 104 are deposited by chemical vapor deposition (CVD). The total thickness of the polycrystalline Si film 103 and $SiO_2$ film 104 is 0.2 μm, same with that of the (BOX layer and SOI layer). The film thickness is set at this value in order to improve the flatness of the substrate and facilitate the subsequent planarization of the $SiO_2$ film embedded in the element isolation region by polishing. The polycrystalline Si film 103 serves to prevent the surface of the bipolar transistor region from being shaved by dry etching in the subsequent step for forming a gate electrode of the MOS transistor and an oxide film on the side surfaces of the gate electrode. By photolithography and dry etching, the polycrystalline Si film 103 and $SiO_2$ film 104 on the SOI layer are then selectively removed. An $Si_3N_4$ film 105 is then deposited by CVD (FIG. 17(*b*)).

From the portions other than the active areas of the bipolar transistor and MOS transistor, the $Si_3N_4$ film 105, $SiO_2$ film 104 and $SiO_2$ film 102 are selectively removed by photolithography and dry etching (FIG. 17(*c*)).

Then by dry etching, the SOI layer and polycrystalline Si film 103 on the portion other than the active areas of the bipolar transistor and MOS transistor are removed, followed by selective removal of the BOX layer 2 and $SiO_2$ film 102 below them. The exposed p type bulk Si substrate is then dug downwards by about 0.2 μm (FIG. 17(*d*)).

After deposition of an $SiO_2$ film 6 by CVD, a portion of the $SiO_2$film deposited outside the trench is removed by polishing such as CMP for planarization. In this step, the $Si_3N_4$ film 105 serves as a stopper of polishing (FIG. 17(*e*)).

After removal of the $Si_3N_4$ film, an $Si_3N_4$ film 106 is deposited by CVD. By photolithography and dry etching, the $Si_3N_4$ film 106 is removed from a predetermined region. The $SiO_2$film 6 and single crystal Si substrate 1 in the same region are dug downwards by anisotropic dry etching to make a trench. After deposition of an $SiO_2$ film 7 by CVD, a portion of the $SiO_2$ film 7 outside the trench is removed by polishing for planarization. This $Si_3N_4$ film serves as a stopper of polishing. The trench having this $SiO_2$ film embedded therein takes a role of element isolation (FIG. 18(*a*)).

Then, the $Si_3N_4$ film 106 and $SiO_2$ films 102, 104 are removed (FIG. 18(*b*)).

The gate portion of the MOS transistor will next be formed. First, an $SiO_2$ film is formed by thermal oxidation of the surfaces of the SOI layer and polycrystalline Si film 103, followed by deposition of a polycrystalline Si film 10 by CVD. By photolithography and dry etching, the polycrystalline Si film 10 is patterned, whereby a gate electrode is formed.

Arsenic ($As^+$) is added to the region of the MOS transistor by ion implantation. An $SiO_2$ film 11 is deposited by CVD and a portion of this $SiO_2$ film other than the sidewalls of the polycrystalline Si film 10 is removed by anisotropic dry etching. At this time, the polycrystalline Si film 103 serves as an etching stopper. By the addition of arsenic to the region of the MOS transistor by ion implantation, source/drain diffusion layers 12 are formed and at the same time, the polycrystalline Si film 10 is converted into n type (FIG. 18(*c*)). The polycrystalline Si film 103 and $SiO_2$ film 102 are then removed (FIG. 18(*d*)).

In the next place, the main portion of the bipolar transistor will be formed. After deposition of an $SiO_2$ film 114 by CVD, a portion of the film in a region wherein the base and emitter of the bipolar transistor are to be formed are selectively removed. By CVD, a $P^+$ type polycrystalline Si film 15 and $SiO_2$ film 16 are then deposited (FIG. 19(*a*)).

By photolithography and dry etching, the $SiO_2$ film 16 and $P^+$ type polycrystalline Si film 15 are selectively removed to form an emitter opening portion. By deposition by CVD and anisotropic etching, an $SiO_2$ film 17 is formed on the side walls of the opening portion. An n+ type polycrystalline Si film 20 is deposited by CVD and then patterned as an emitter electrode by photolithography and dry etching. An n+ type Si layer 21 is then formed by heat treatment. The $SiO_2$ film 16 is patterned into the same shape to expose the P+ type polycrystalline Si film 15, and this exposed film is then patterned as a base lead-out electrode (FIG. 19(b)).

Various interconnection structures are thereafter formed on the above-described device by the conventional manner to complete the fabrication of a BiCMOS device. The BiCMOS of the first embodiment is thus fabricated.

A description will next be made of another fabrication process of the device of the first embodiment based on FIGS. 20(a) to 20(e). First, a buried $SiO_2$ film (BOX layer) 2 and SOI layer 3 are formed on a p type bulk substrate 1 by the SIMOX method. Without removing the SOI layer and BOX layer and while covering a portion to be the SOI structure region with a photoresist 101 of 2 $\mu$m thick (in other words, while partially exposing the SOI layer of a region wherein the bipolar transistor is to be formed), phosphorus (P+) ions are implanted inside of the bulk Si substrate at an accelerating energy of 700 keV by ion implantation. A small amount of phosphorous ions are then implanted at an accelerating energy of 100 keV to the same region (this implantation can be omitted because it can be conducted simultaneously upon the above-described high-concentration ion implantation). Then, phosphorous ions are selectively implanted at a high concentration with an accelerating energy of 300 keV so that they are brought into contact with a portion of the buried region to which phosphorous ions have been implanted at a high concentration. By heating, a buried n+ type Si collector layer 4, n− type Si collector layer 5 and n+ type Si collector lead-out layer 8 are formed. The largest difference from the first fabrication process is that in the second process, ion implantation is conducted by allowing ions to pass through the SOI layer 3 and BOX layer 2 (FIG. 20(a)).

After removal of the photoresist film 101, an $SiO_2$ film 102 and an $Si_3N_4$ film 105 are deposited by CVD. By photolithography and dry etching, the $Si_3N_4$ film 105, $SiO_2$ film 102, SOI layer 3 and BOX layer 2 are then selectively removed from a portion other than the active areas of the bipolar transistor and MOS transistor. The exposed p−type bulk Si substrate is then dug downwards by about 0.2 $\mu$m (FIG. 20(b)).

After deposition of an $SiO_2$ film 6 by CVD, a portion of this film outside the trench is removed by polishing for planarization. The $Si_3N_4$ film 105 serves as a stopper for polishing (FIG. 20(c)).

Figure 18A:
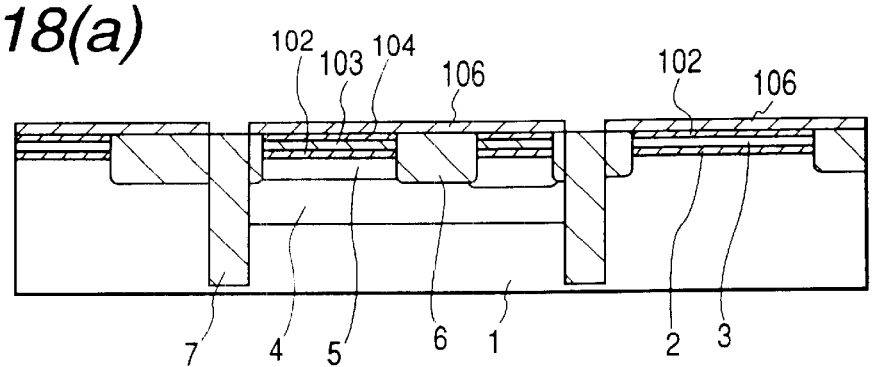
FIGS. 18(a) to 18(d) are cross-sectional views illustrating each of the main steps of the fabrication process of the BiCMOS device according to Embodiment 1 of the present invention.
Figure 18B:
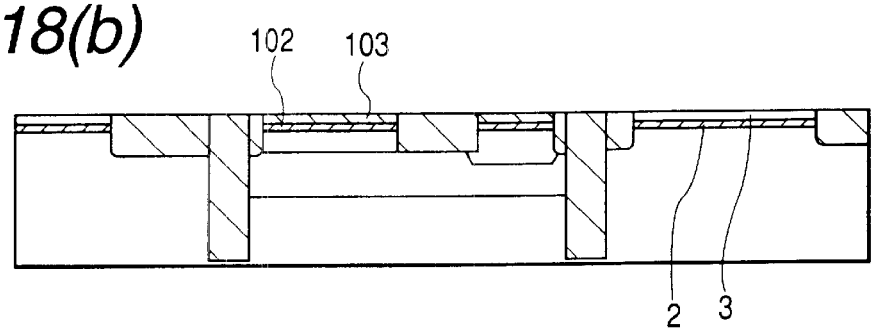
Figure 18C:
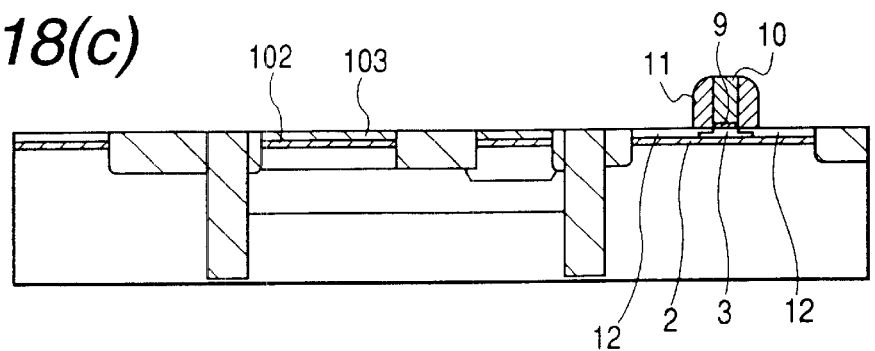
Figure 18D:
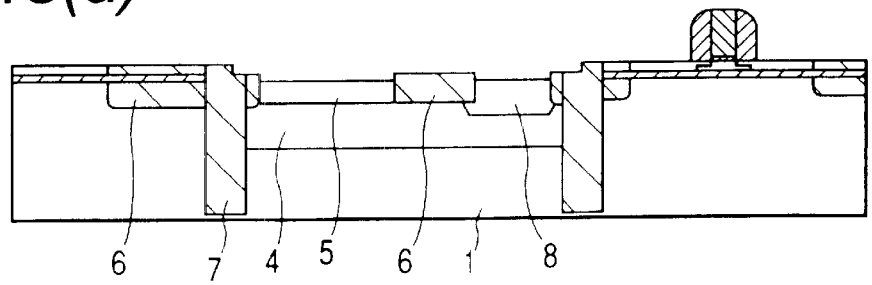

Next, a trench 7 having this $SiO_2$ film embedded therein is formed by the process as described in FIGS. 18(a) and 18(b) of the first fabrication process. The insulating film is removed to expose the SOI layer 3. At this stage, the SOI layer is left on the bipolar transistor and it serves as a substitute for the polycrystalline Si film 103 in the first fabrication process (FIG. 20(d)).

Figure 20A:
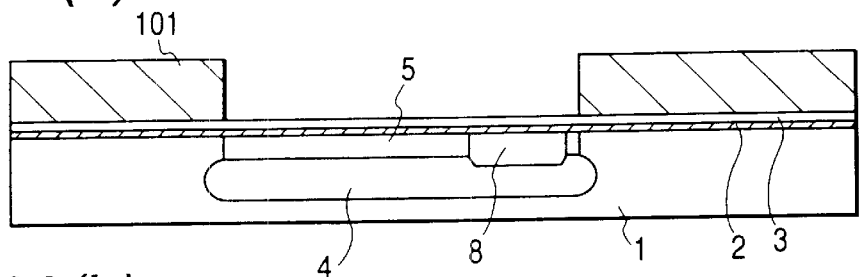
FIGS. 20(a) to 20(e) are cross-sectional views illustrating each of the main steps of another fabrication process of the BiCMOS device according to Embodiment 1 of the present invention.
Figure 20B:
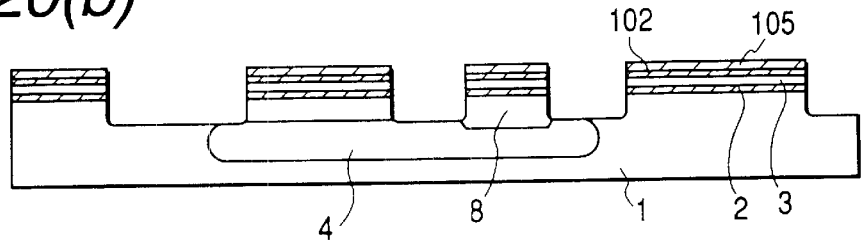
Figure 20C:
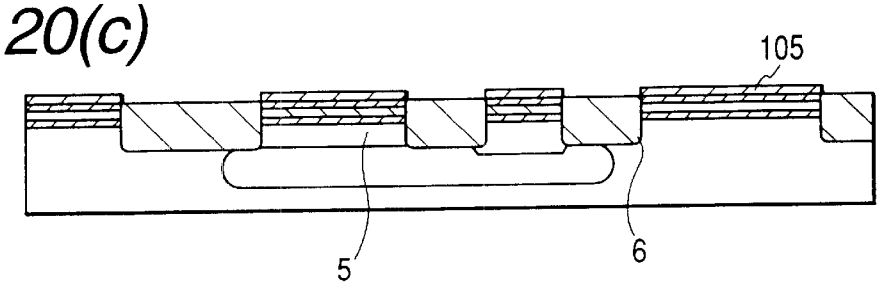
Figure 20D:
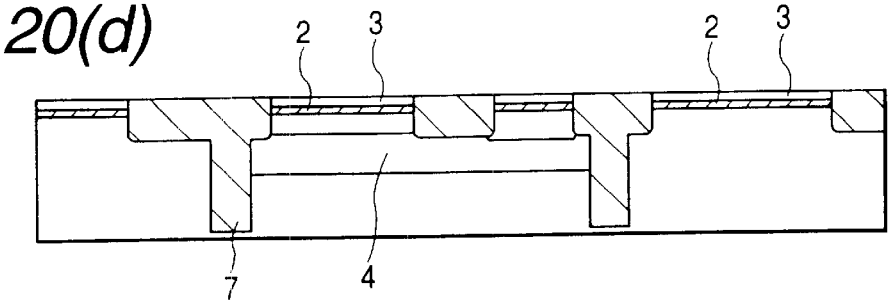
Figure 20E:
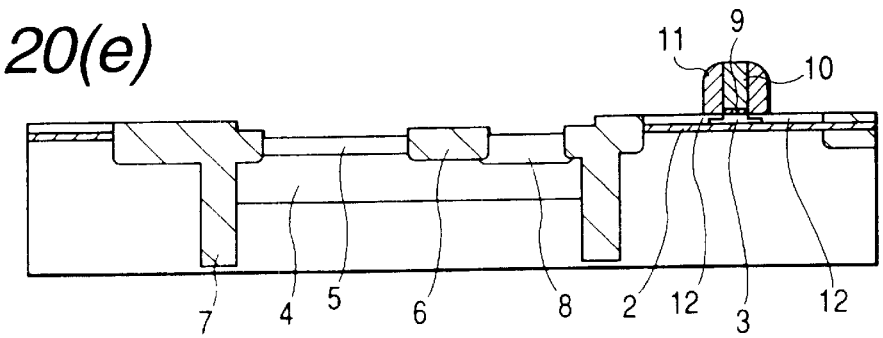

After formation of the MOS transistor by the process similar to that of the first fabrication process, the SOI layer 3 and BOX layer 2 on the bipolar transistor are removed (FIG. 20(e)).

Steps subsequent thereto are similar to those of the first fabrication process. Compared therewith, the second process is advantageous in that the number of process steps for of film deposition by CVD or dry etching can be reduced, leading to simplification of the fabrication process.

Figure 7:
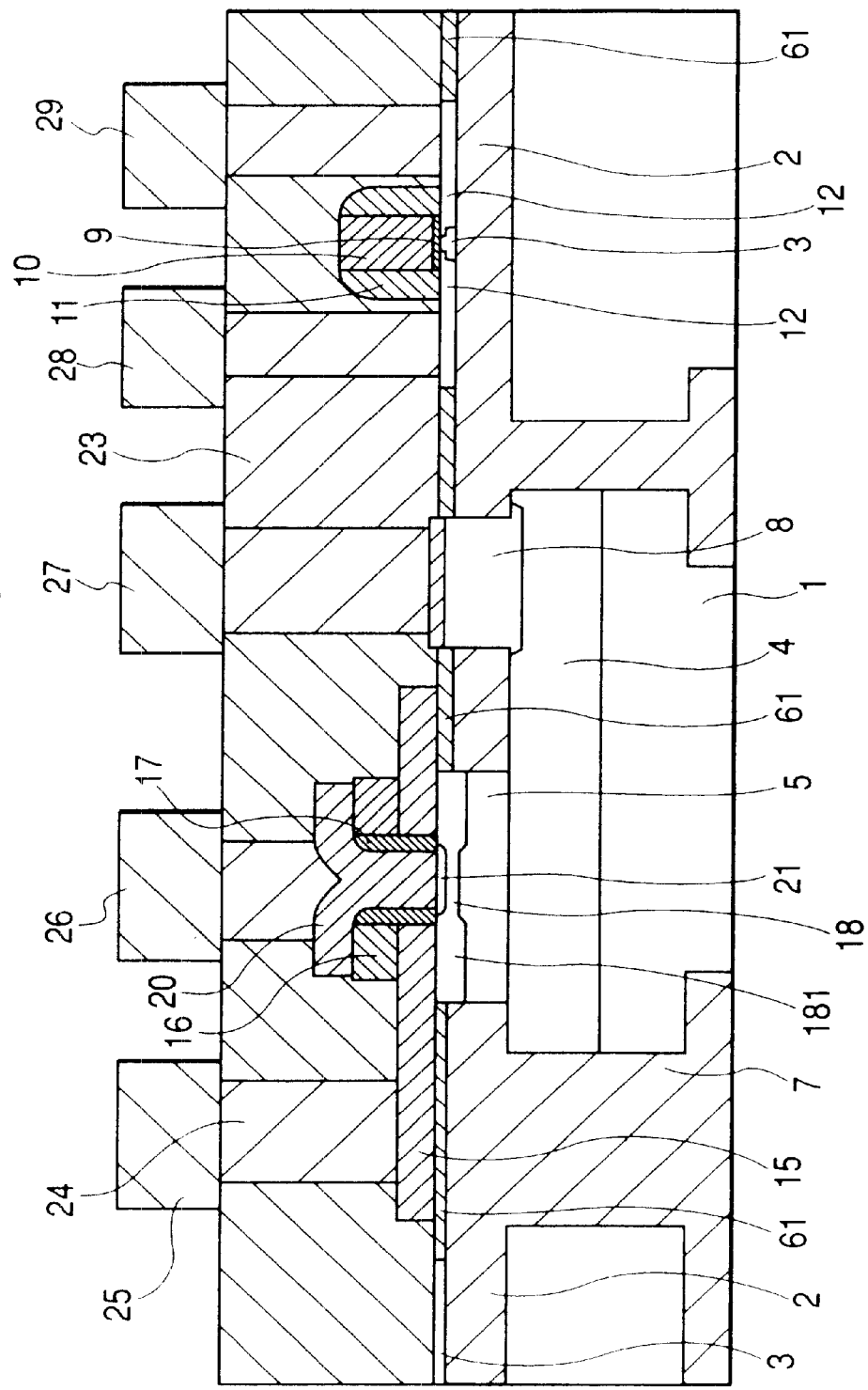
FIG. 7 is a cross-sectional view of a BiCMOS device for describing a problem to be solved by the present invention.

According to the first embodiment, the above-described problems can be overcome. Even if the total thickness of the (SOI layer+BOX layer) is 0.35 $\mu$m or less, the resulting BiCMOS device has both a vertical bipolar transistor having high breakdown voltage and low parasitic capacitance and a SOIMOSFET. The breakdown voltage and parasitic capacitance of the bipolar transistor can be designed freely by changing the ion implantation depth for the formation of a buried collector layer. In this Embodiment 1, a low-doped collector layer can be formed through an ion implantation mask used upon formation of a buried collector layer, making it possible to omit the low-doped collector layer forming steps, that is, epitaxial growth of single crystal Si and planarization by polishing described in FIGS. 7 and 8. These steps are low in throughput so that the present process free of them is also effective for a large cost reduction.

In this first embodiment, the height position of the lower surface of the insulating film which is in contact with the active area of the bipolar transistor in the surrounding form is lower than the height position C of the lower surface of the BOX layer, which brings about effects for further reducing the parasitic capacitance between base and collector. An insulating film of this structure is formed in the SOI structure region for element isolation of the MOS transistor. The formation of the element isolation structure of the MOS transistor can therefore be conducted simultaneously with the formation of a trench isolation of the bipolar transistor, which also brings about effects for simplifying the process.

By changing the ion implantation energy for the formation of the n+ type Si layer 4 between the bipolar transistors on the same chip, thereby changing their depth, plural bipolar transistors different in the breakdown voltage and operation speed, therefore different in the role can be integrated easily on the same chip together with SIMOSFET.

The embodiment 1 makes it possible to integrate a vertical bipolar transistor having a high breakdown voltage and low parasitic capacitance and a SOIMOSFET even if the (SOI layer+BOX layer) is as thin as 0.35 $\mu$m or less or the SOI layer is as thin as 0.15 $\mu$m or less.

Embodiment 2

Figure 2:
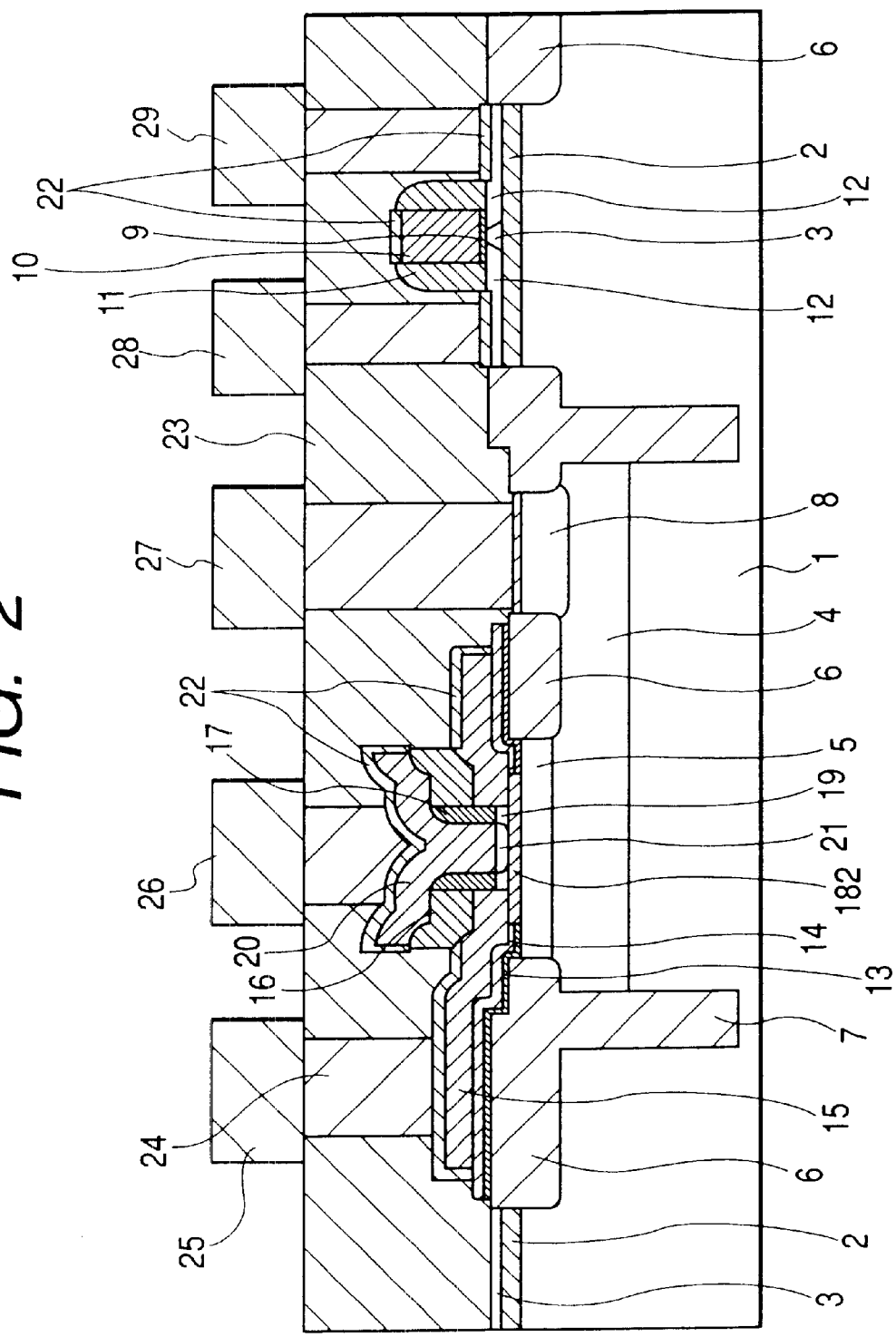
FIG. 2 is a cross-sectional view illustrating a BiCMOS device according to Embodiment 2 of the present invention.

The second embodiment of the present invention will next be described based on FIG. 2. FIG. 2 illustrates the longitudinal cross-sectional structure of a BiCMOS device according to the second embodiment of the present invention. In this diagram, like reference numerals indicate like members or like sites in FIG. 1. Reference numerals not included in FIG. 1 are as follows: indicated at reference numeral 13 is an $SiO_2$ film, 14 a $Si_3N_4$ film, 182 a p type SiGe alloy layer, and 19 a non-doped single crystal Si layer. The layer 4 serves as an n+ type buried collector layer for bipolar transistor, 5 as an n type low-doped collector layer, 182 a base layer and 21 an emitter diffusion layer. Between the low-doped collector layer 5 and the p type SiGe alloy layer 182 serving as base layer, a non-doped SiGe alloy layer 19 of about 10 nm (nanometer) to 50 nm (nanometer) thick may be inserted.

In this embodiment, the positional relationship among the surface (height position A) of the SOI layer, the surface (B) of the bulk structure region, the lower surface (C) of the BOX layer and the upper surface (D) and lower surface (E) of the low-doped collector layer of the bipolar transistor is equal to that shown in FIG. 12. Described specifically, the height position (D) of the upper surface of the low-doped collector layer 5 is equal to the lower surface (C) of the BOX layer. The lower surface (E) of the low-doped collector 5 is about 0.3 µm below the lower surface (C) of the BOX layer. The thickness of the low-doped collector layer 5 is about 0.3 µm (micrometer). The total thickness of the (BOX layer+ SOI layer) is 0.2 µm (micrometer).

A fabrication process of the BICMOS device according to this Embodiment 2 will next be described. The fabrication process of this Embodiment 2 is almost similar to that of the first embodiment in the steps from FIGS. 18(a) to 18(d) or FIGS. 20(a) to 20(e). It is however to be noted that the ion implantation energy for the formation of a buried $n^+$ type collector layer 4 is however set by about 100 keV lower than that of the first embodiment, because the depth position of the $n^+$ type buried collector layer 4 relative to the position of the bulk Si surface is about 0.1 µm shallower than that of the first embodiment.

Figure 21A:
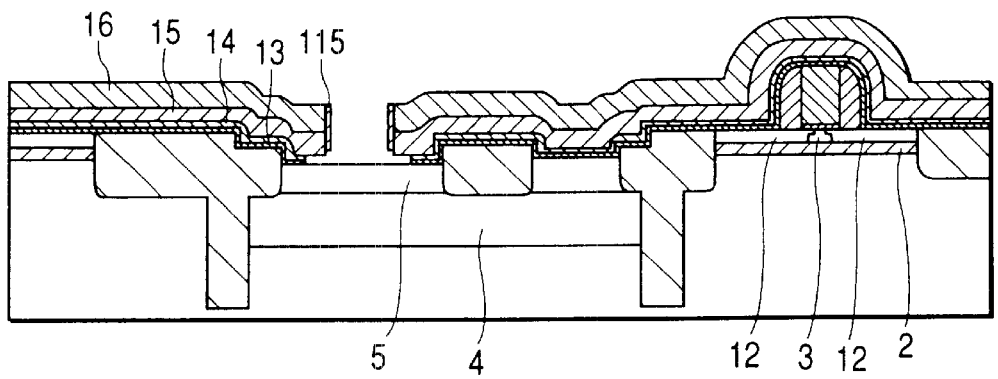
FIGS. 21(a) to 21(c) are cross-sectional views illustrating each of the main steps of the fabrication process of the BiCMOS device according to Embodiment 2 of the present invention.

Subsequent fabrication steps will next be described based on FIGS. 21(a) to 21(c), which each illustrates a longitudinal cross-sectional structure of a vertical bipolar transistor and an nMOS transistor in the main step. First, an $SiO_2$ film 13, $Si_3N$, film 14, $P^+$ type polycrystalline Si film 15 and $SiO_2$ film 16 are deposited by CVD. Then, by photolithography and dry etching, the $SiO_2$ film 16 and $P^+$ type polycrystalline Si film 15 are selectively removed to form an emitter opening portion. On the side walls of this opening portion, an $SiO_2$ film 115 is formed by deposition by CVD and anisotropic etching. The $Si_3N_4$ film 14 and $SiO_2$ film 13 are then removed by wet etching to expose the bulk Si substrate (FIG. 21(a)).

Figure 21B:
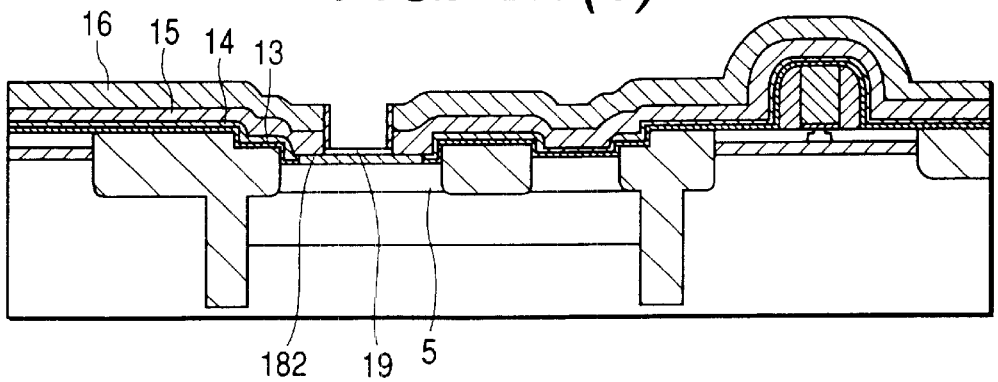
Figure 21C:
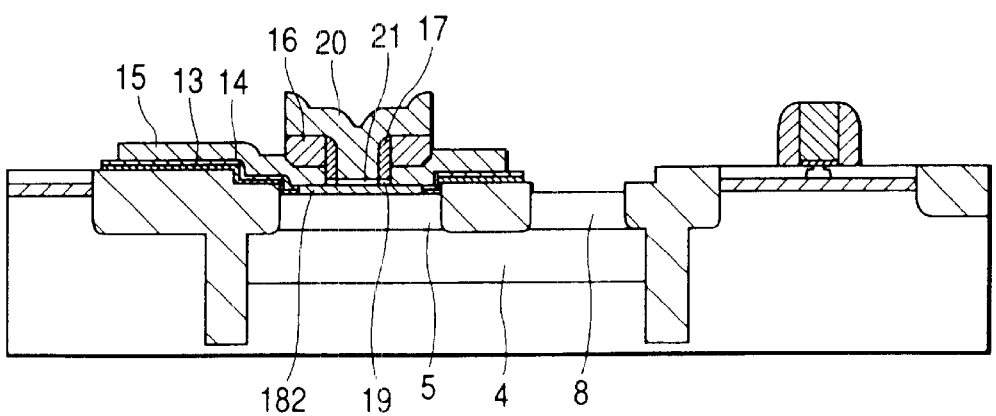

On the exposed bulk Si substrate, a p type SiGe alloy layer 182 and non-doped single crystal Si layer 19 are grown by CVD (FIG. 21(b)).

In a similar manner to that employed in the first embodiment, an $n^+$ type polycrystalline Si film 20 is deposited and then patterned to form an emitter electrode, followed by heat treatment whereby an $n^+$ type Si layer 21 is formed. A base lead-out electrode 15 is then patterned (FIG. 21(c)).

This second embodiment has effects similar to the first embodiment. Moreover, in this second embodiment, the height position of the Si surface in the bulk structure region becomes higher than that of the first embodiment, bringing about an improvement in the flatness of the substrate. As a result, the emitter opening-portion can be formed with higher precision than that of the first embodiment and a yield of the transistor can be improved. Furthermore, the base and emitter layers are formed by epitaxial growth so that compared with the first embodiment wherein these layers are formed by diffusion in the bulk Si substrate wherein a damage due to ion implantation has still remained, the second embodiment is effective for increasing the yield of the transistor further. As described above, since the base region having a high impurity concentration can be formed thin and in addition the base region is formed from an SiGe alloy, both a bipolar transistor which can be operated at a higher speed and a high-speed MOSFET formed in SOI are allowed to exist side by side and are integrated in one semiconductor substrate. In short, this embodiment makes it possible to allow both a vertical bipolar transistor having a high breakdown voltage and low parasitic capacitance and an SOIMOSFET to coexist on one semiconductor substrate even if the (SOI layer+BOX layer) is as thin as 0.35 µm (micrometer) or less or the SOI layer is as thin as 0.15 µm (micrometer) or less.

Embodiment 3

Figure 3:
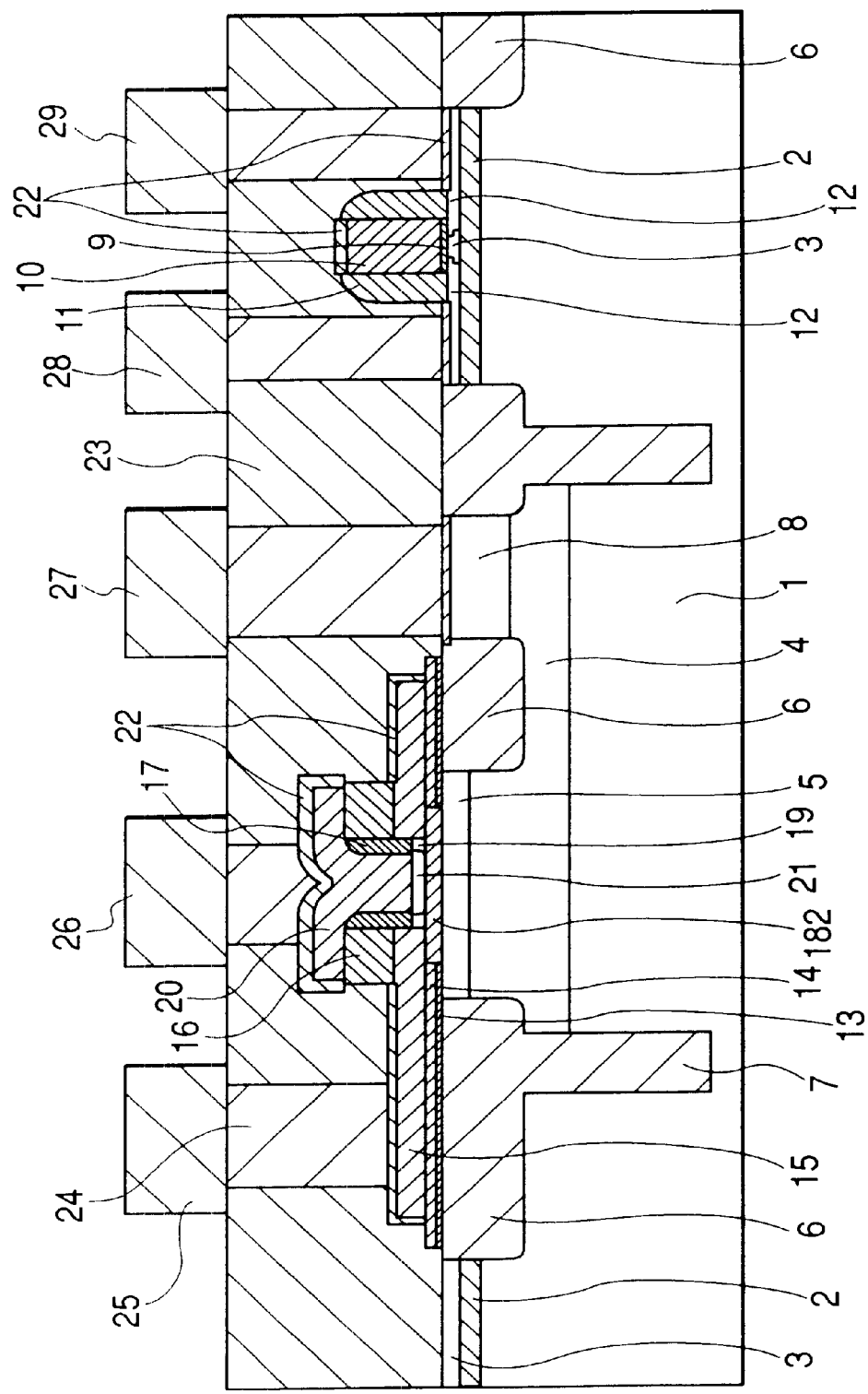
FIG. 3 is a cross-sectional view illustrating a BiCMOS device according to Embodiment 3 of the present invention.

The third embodiment of the present invention will next be described based on FIG. 3. FIG. 3 illustrates a longitudinal cross-sectional structure of a BiCMOS device according to the third embodiment of the present invention. In this diagram, like reference numerals indicate like members or like sites in FIG. 2.

Indicated at a reference numeral 4 is an buried collector layer for bipolar transistor, 5 a low-doped collector layer, 182 a base layer and 21 an emitter diffusion layer. Between the low-doped collector layer 5 and the p type SiGe alloy layer as the base layer 182, a non-doped SiGe alloy layer of about 10 nm (nanometer) to 50 nm (nanometer) thick may be inserted.

Figure 14:
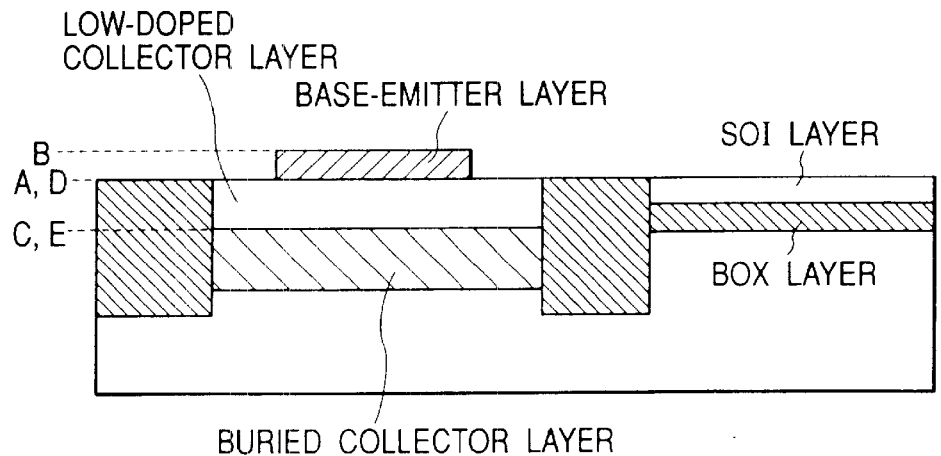
FIG. 14 is a schematic cross-sectional view illustrating the BiCMOS device according to Embodiment 3 of the present invention.

In this embodiment 3, the positional relationship among the surface (height position A) of the SOI layer, the surface (B) of the bulk structure region, the lower surface (C) of the BOX layer and the upper surface (D) and lower surface (E) of the low-doped collector layer of the bipolar transistor is equal to that shown in FIG. 14. Described specifically, the height position (D) of the upper surface of the low-doped collector layer 5 is equal to the surface (A) of the SOI layer, while the height position (B) of the surface of bulk structure region is higher than the surface (A) of the SOI layer. The lower surface (E) of the low-doped collector layer 5 is equal to the lower surface (C) of the BOX layer. Accordingly, the thickness of the low-doped collector is equal to the total thickness of (BOX layer+SOI layer) and is 0.3 µm (micrometer).

The fabrication process of the BiCMOS device according to this embodiment will next be described based on FIGS. 22(a) to 22(f) and FIGS. 23(a) to 23(e), which each illustrates a longitudinal cross-sectional structure in the main fabrication step of a vertical npn bipolar transistor and n type MOS transistor.

First, a buried $SiO_2$ film (BOX layer) 2 and SOI layer 3 are formed over a $P^-$type bulk substrate 1 by the SIMOX method (an SOI wafer is prepared). In this case, implantation conditions of oxygen ions are set so that the total thickness of the (BOX layer and SOI layer) will be 0.3 µm. An $SiO_2$ film 102 and $Si_3N_4$ film 107 are then deposited by CVD. While a portion to be an SOI structure region is covered with a photoresist 101, phosphorus ions ($P^+$) are implanted into the bulk Si substrate at an accelerating energy of 200 keV by ion implantation. By heating, an $n^+$ type Si layer 4 is then formed (FIG. 22(a)).

Figure 22A:
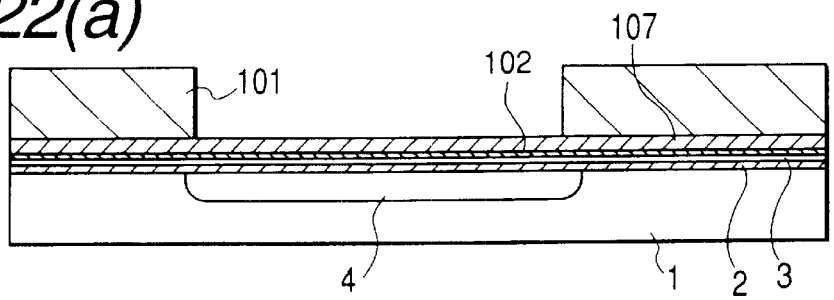
FIGS. 22(a) to 22(f) are cross-sectional views illustrating each of the main steps of the fabrication process of the BiCMOS device according to Embodiment 3 of the present invention.
Figure 22B:
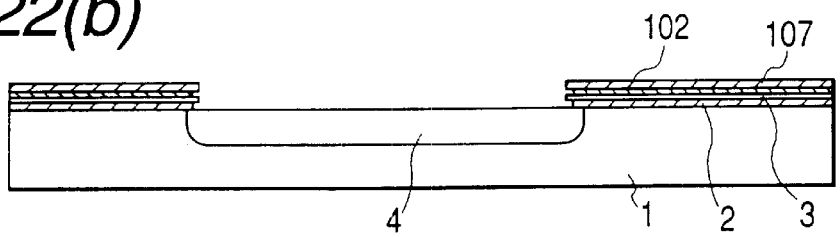
Figure 22C:
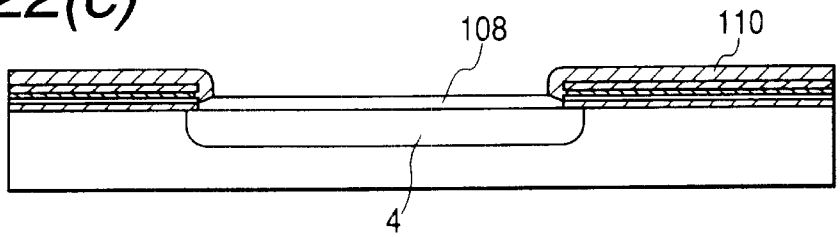

The $Si_3N_4$ film 107, $SiO_2$ film 102, SOI layer 3 and BOX layer 2 on the $n^+$ type Si layer 4 are then selectively removed by dry etching and wet etching, whereby the $n^+$ type Si layer 4 is exposed (FIG. 22(b)).

By CVD, an $n^-$type single crystal Si layer 108 and a polycrystalline Si film 110 are grown on the $n^+$ type Si layer 4 and $Si_3N_4$ film 107, respectively. Upon growth, the surface height of the $n^-$type single crystal Si layer 108 is adjusted to become almost equal to that of the surface of the SOI layer (FIG. 22(c)).

Figure 22D:
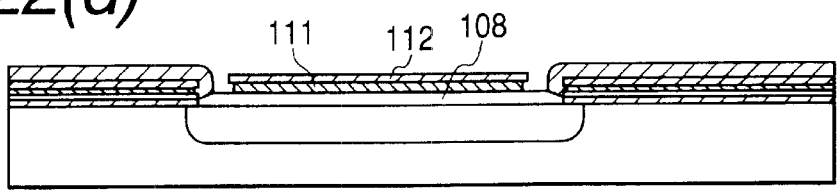
Figure 22E:
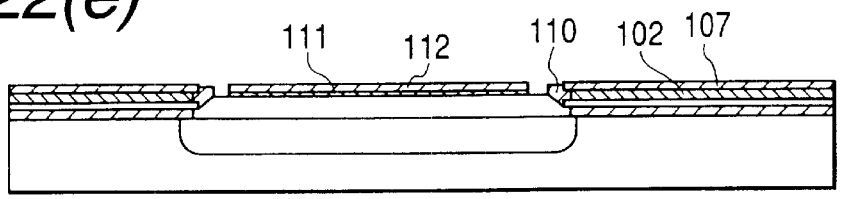
Figure 22F:
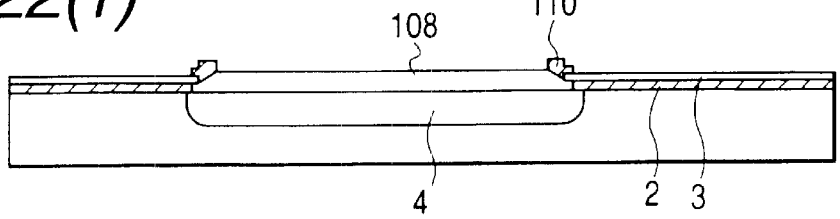
Figure 23A:
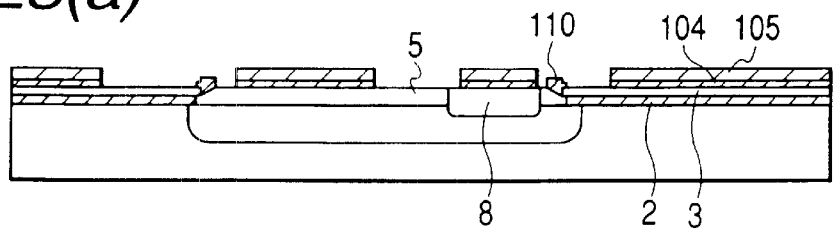
FIGS. 23(a) to 23(e) are cross-sectional views illustrating each of the main steps of the fabrication process of the BiCMOS device according to Embodiment 3 of the present invention.
Figure 23B:
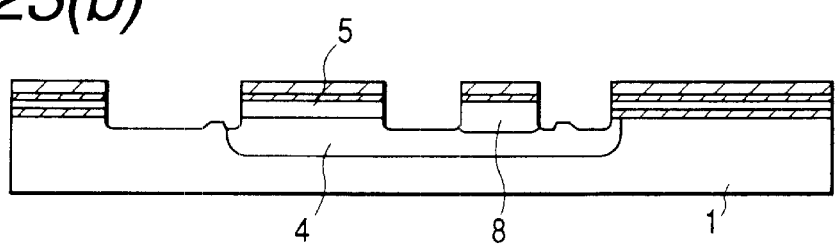
Figure 23C:
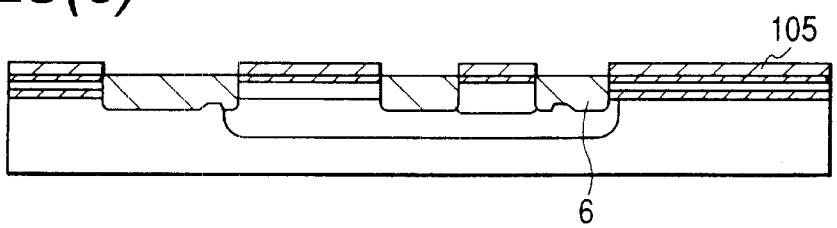
Figure 23D:
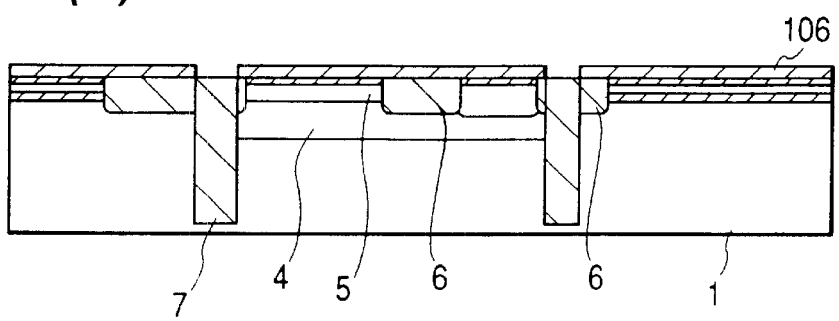
Figure 23E:
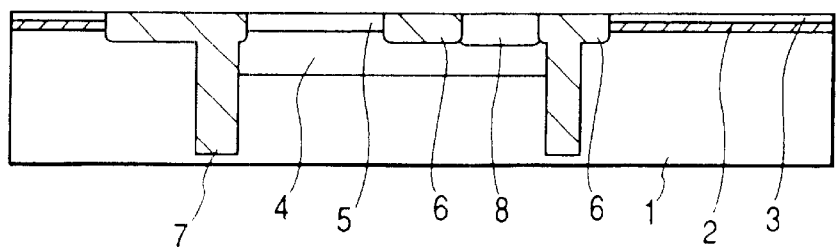

After deposition of an $SiO_2$ film 111 and $Si_3N_4$ film 112 by CVD, these films on the SOI structure region are selectively removed (FIG. 22(d)). These films are set to have almost similar thickness as the $SiO_2$ film 102 and $Si_3N_4$ film 107, respectively. Setting of this film thickness is made to facilitate planarization by polishing. In the subsequent step, the polycrystalline Si film 110 on the SOI structure region is removed by polishing with the $Si_3N_4$ films 107, 112 as a stopper (FIG. 22(e)).

By wet etching, $Si_3N_4$ films 107 and 112 and $SiO_2$ films 102 and 111 are removed. The $n^+$ type Si layer 4 becomes a buried collector layer, while the n type single crystal Si layer 108 becomes a low-doped collector layer (FIG. 22(f)).

Phosphorus ions (p$^+$) are then selectively implanted at an accelerating energy of 100 keV into a portion on the n$^+$ type Si layer 4 to form an n$^+$ type Si layer 8. Then, an SiO$_2$ film 104 and Si$_3$N$_4$ film 105 are deposited by CVD. By photolithography and dry etching, the films on a region outside the portions which will be the active areas of a bipolar transistor and MOS transistor are then selectively removed (FIG. 23(a)).

The SOI layer 3, polycrystalline Si film 110 and BOX layer 2 on the same region are selectively removed. The p type bulk Si substrate exposed by dry etching is dug downwards by about 0.2 μm (FIG. 23(b)).

After formation of an SiO$_2$ film 6 by CVD, a portion of the film outside the trench is removed by polishing for planarization. The Si$_3$N$_4$ film 105 serves as a stopper for polishing (FIG. 23(c)).

A trench 7 having an SiO$_2$ film embedded therein is formed by the process as described in the fabrication process of the first embodiment based on FIGS. 18(a) and 18(b) (FIG. 23 (d)). The insulating film is removed to expose the SOI layer 3 and n type single crystal Si layer (FIG. 23(e)). Steps subsequent thereto are carried out in a manner similar to that described in the second embodiment based on FIGS. 21(a) to 21(c).

According to the third embodiment, the above-described problems can be overcome. Even if the (SOI layer+BOX layer) is as thin as 0.35 μm or less, or the SOI layer is as thin as 0.15 μm or less, a vertical bipolar transistor having high breakdown voltage and low parasitic capacitance can be allowed to coexist with SOIMOSFET. This embodiment 3 is free from occurrence of crystal defects in the low-doped collector layer which seems to cause a problem in the case where a low-doped collector layer is formed by ion implantation as in the first or second embodiment, bringing about an improvement in the yield of the bipolar transistor. In addition, the flatness of the substrate is better than that in the first or second embodiment so that the emitter opening portion can be formed with higher precision, resulting in an increase in the yield. This embodiment is therefore advantageous when applied to an integrated circuit having many bipolar transistors mounted thereon. Moreover, upon planarization by polishing after epitaxial growth for the formation of a low-doped collector layer, the height of the surface of the bulk structure region becomes equal to that of the surface of the SOI layer. This embodiment therefore brings about effects for carrying out planarization more easily than the below-described fourth embodiment of the present invention wherein these heights are not equal.

Embodiment 4

Figure 4:
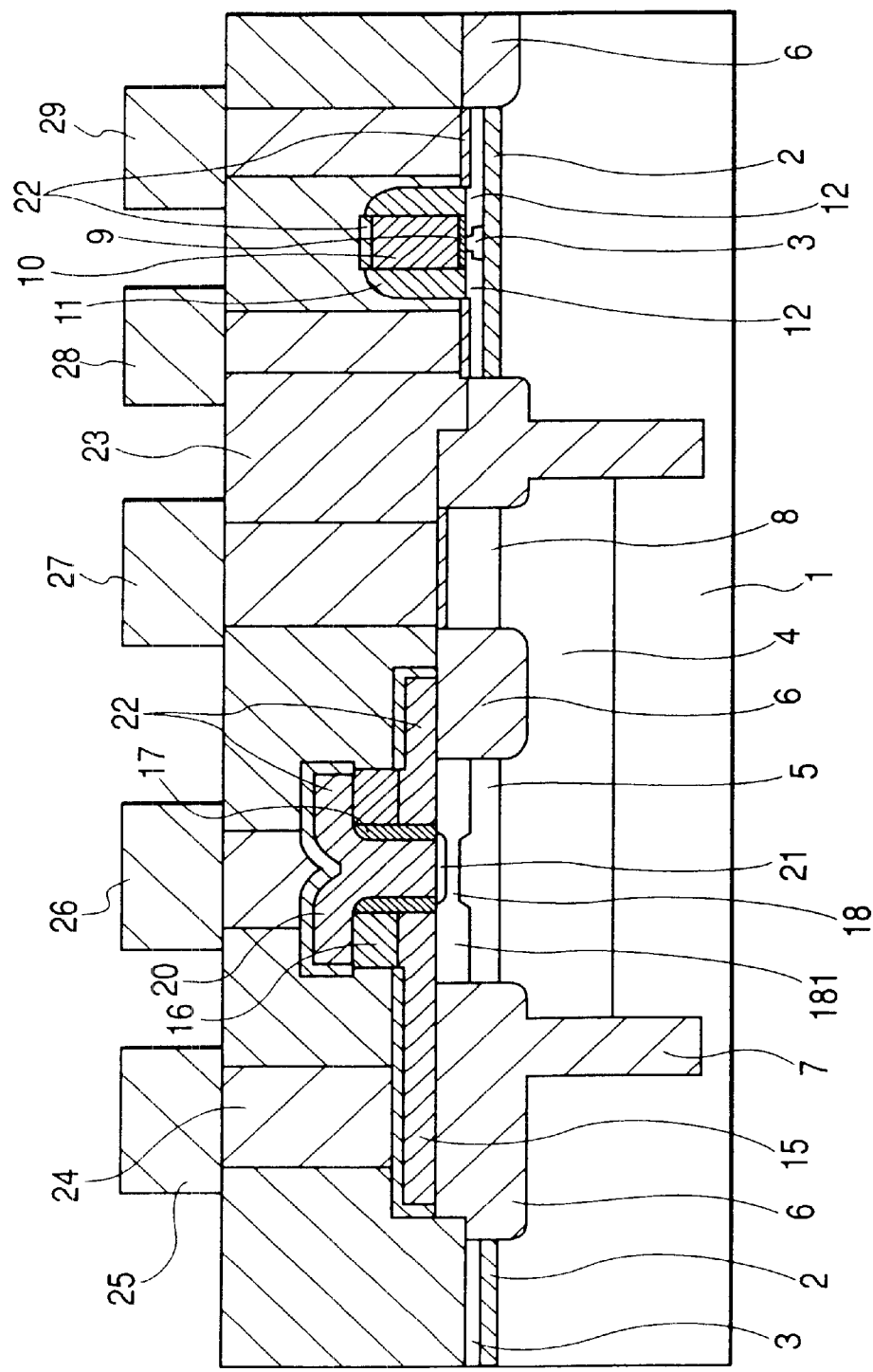
FIG. 4 is a cross-sectional view illustrating a BiCMOS device according to Embodiment 4 of the present invention.

The fourth embodiment of this invention will next be described based on FIG. 4. FIG. 4 illustrates the longitudinal cross-sectional structure of a BiCMOS device according to the fourth embodiment of the present invention. In this diagram, like reference numerals indicate like members or like sites in FIG. 1. Indicated at numeral 4 is a buried collector layer of a bipolar transistor, 5 a low-doped collector layer, 18 a base layer and 21 an emitter diffusion layer.

In this embodiment, the positional relationship among the surface (height position A) of the SOI layer, the surface (B) of the bulk structure region and the lower surface (C) of the BOX layer, and upper surface (D) and lower surface (E) of the low-doped collector layer of the bipolar transistor is equal to that shown in FIG. 13. Described specifically, the height position (B) of the bulk structure region and the height position (D) of the upper surface of the low-doped collector layer 5 are each 0.15 μm higher than the surface (A) of the SOI layer. The lower surface (E) of the low-doped collector layer 5 is identical to the lower surface (C) of the BOX layer. The total thickness of the (BOX layer and SOI layer) is 0.25 μm (micrometer), while the thickness of the low-doped collector layer 5 is 0.3 μm (micrometer).

In the next place, a fabrication process of the BiCMOS device of Embodiment 3 will be described based on FIGS. 24(a) to 24(f) and FIGS. 25(a) to 25(e). These diagrams each illustrates the vertical npn bipolar transistor and n type MOS transistor in the main fabrication step. In the fabrication process of this embodiment, steps as illustrated in FIGS. 24(a) to 24(f) and FIGS. 25(a) to 25(c) are fundamentally same as those of the third embodiment as illustrated in FIGS. 22(a) to 22(f) and FIGS. 23(a) to 23(c), but the surface height of the bulk structure region is set higher than that of the SOI layer in this third embodiment. In the planarization step by polishing, the thickness of the insulating film which serves as a stopper is adjusted to differ between on the bulk structure region and on the SOI layer.

First, an SiO$_2$ film (BOX layer) 2 and SOI layer 3 are formed by the SIMOX method (an SOI wafer is prepared). In this case, implantation conditions of oxygen ions are set so that the total thickness of the (BOX layer and SOI layer) will be 0.25 μm. An SiO$_2$ film 102 and Si$_3$N$_4$ film 107 of 0.2 μm thick are then deposited by CVD. While a portion to be an SOI structure region is covered with a photoresist film 101, phosphorus ions (P$^+$) are implanted into the bulk Si substrate at an accelerating energy of 300 kev by ion implantation. By heating, an n$^+$ type Si layer 4 is then formed (FIG. 24(a)).

Figure 24A:
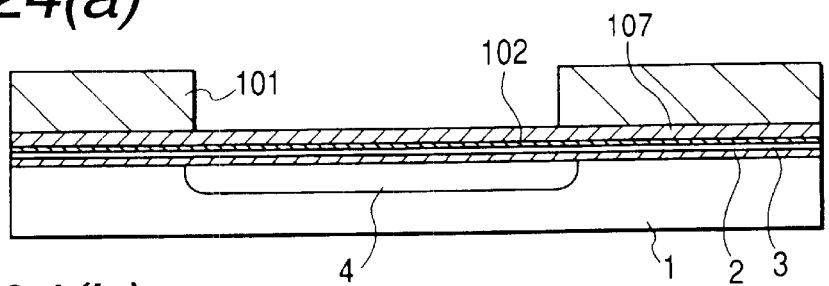
FIGS. 24(a) to 24(f) are cross-sectional views illustrating each of the main steps of the fabrication process of the BiCMOS device according to Embodiment 4 of the present invention.
Figure 24B:
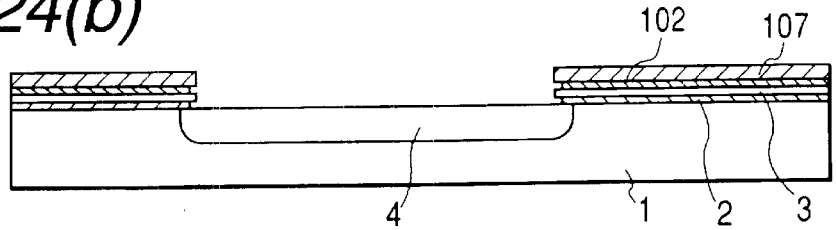
Figure 24C:
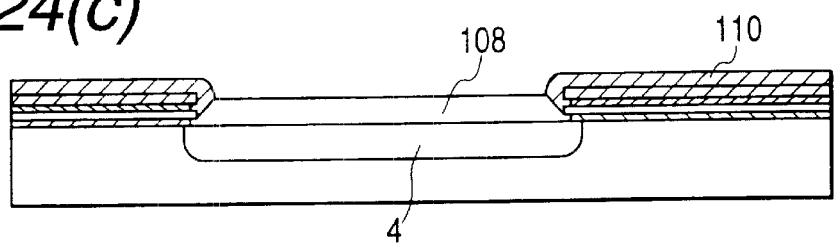

The Si$_3$N$_4$ film 107, SiO$_2$ film 102, SOI layer 3 and SiO$_2$ layer 2 on the n$^+$ type Si layer 4 are then selectively removed by dry etching and wet etching, whereby the n$^+$ type Si layer 4 is exposed (FIG. 24(b)).

By CVD, an n$^-$type single crystal Si layer 108 and a polycrystalline Si film 110 are grown on the n$^+$ type Si layer 4 and Si$_3$N$_4$ film 107, respectively. The thickness of each of these films is adjusted to 0.4 μm (FIG. 24(c)).

Figure 24D:
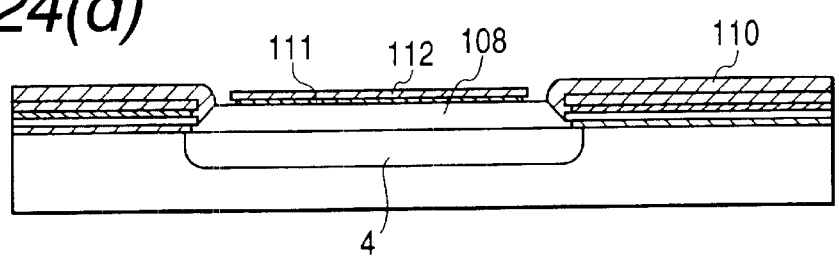
Figure 24E:
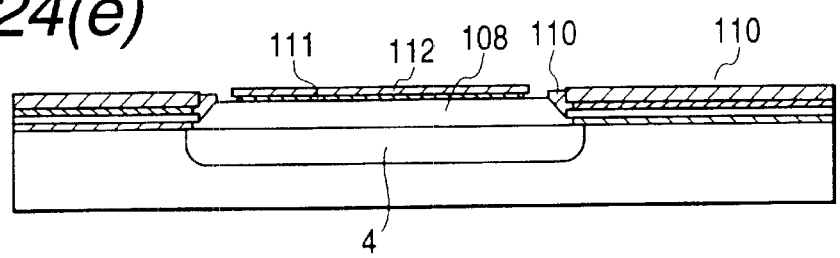
Figure 24F:
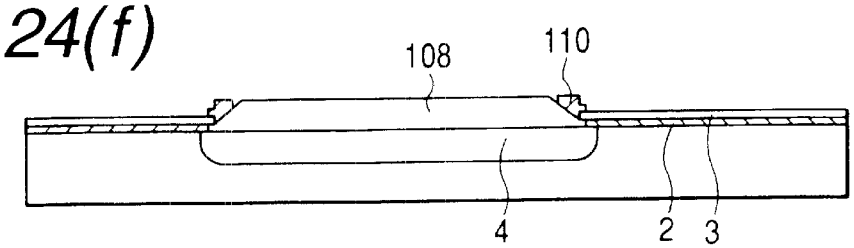

After deposition of an SiO$_2$ film 111 and Si$_3$N$_4$ film 112 of 0.05 μm thick by CVD, these films on the SOI structure region are selectively removed (FIG. 24(d)). The polycrystalline Si film 110 on the SOI structure region is then removed by polishing with the Si$_3$N$_4$ films 107, 112 as a stopper for polishing (FIG. 24(e)). By wet etching, the Si$_3$N$_4$ films 107 and 112 and SiO$_2$ films 102 and 111 are removed. The n$^+$ type Si layer 4 becomes a buried collector layer, while the n$^-$type single crystal Si layer 108 becomes a low-doped collector layer (FIG. 24(f)).

Phosphorus ions (P$^+$) are then selectively implanted at an accelerating energy of 100 keV into a portion on the n$^+$ type Si layer 4, whereby an n$^+$ type Si layer 8 is formed. Then, an SiO$_2$ film 104 of 0.15 μm thick is deposited by CVD. By photolithography and dry etching, the film is then selectively removed from a region other than the active area of the MOS transistor. An SiO$_2$ film 113 of 0.05 μm thick and Si$_3$,N film 105 are deposited by CVD. By photolithography and dry etching, these films are selectively removed from a region other than regions which will be active areas of the bipolar transistor and MOS transistor (FIG. 25(a)).

The SOI layer 3, polycrystalline Si film 110 and BOX layer 2 in a region other than regions which will be the above-described active areas are then selectively removed. The p type bulk Si substrate exposed by dry etching is dug downwards by about 0.2 μm (FIG. 25(b)). After deposition of an SiO$_2$ film 6 by CVD, a portion of the film outside the trench is removed by polishing for planarization. The Si₃N₄ 105 serves as a stopper for polishing (FIG. 25(c)).

Figure 19A:
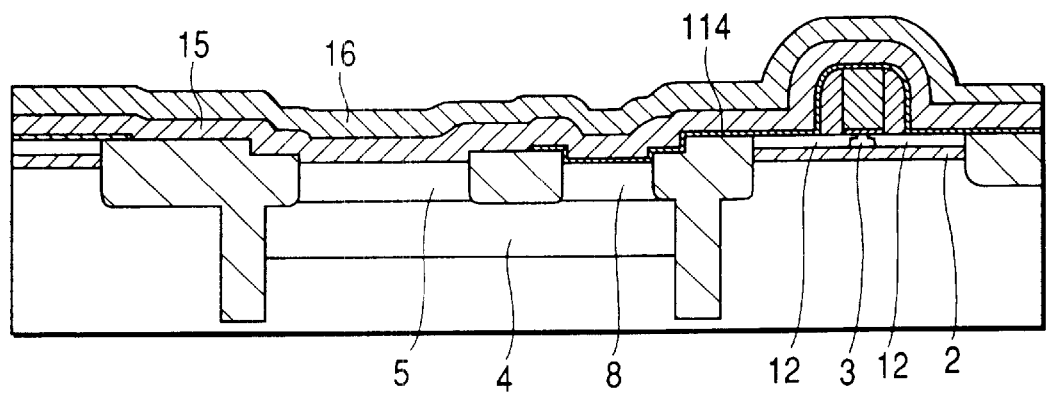
FIGS. 19(a) and 19(b) are cross-sectional views illustrating each of the main steps of the fabrication process of the BiCMOS device according to Embodiment 1 of the present invention.
Figure 19B:
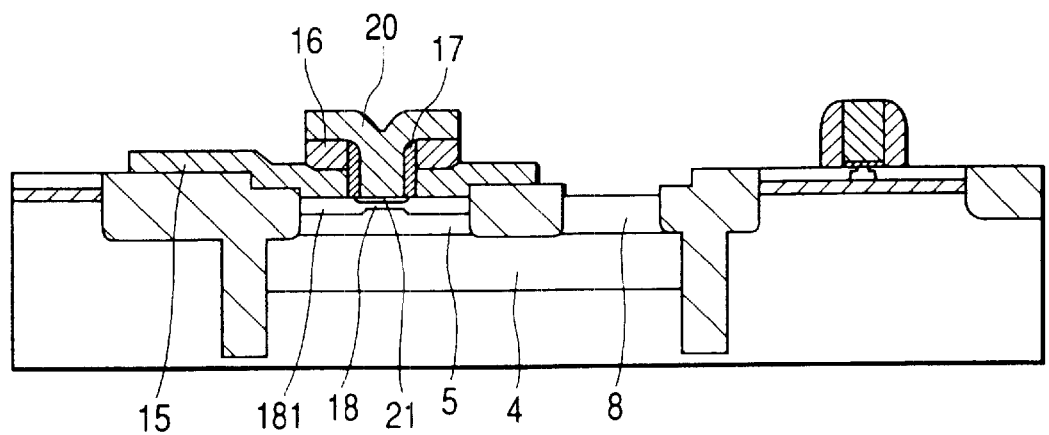
Figure 25A:
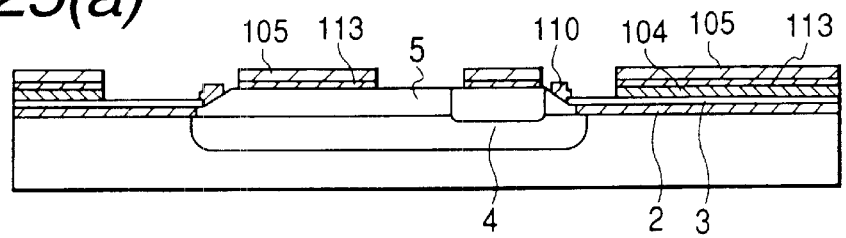
FIGS. 25(a) to 25(e) are cross-sectional views illustrating each of the main steps of the fabrication process of the BiCMOS device according to Embodiment 4 of the present invention.
Figure 25B:
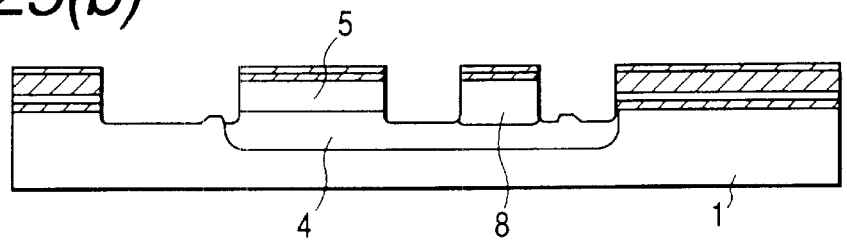
Figure 25C:
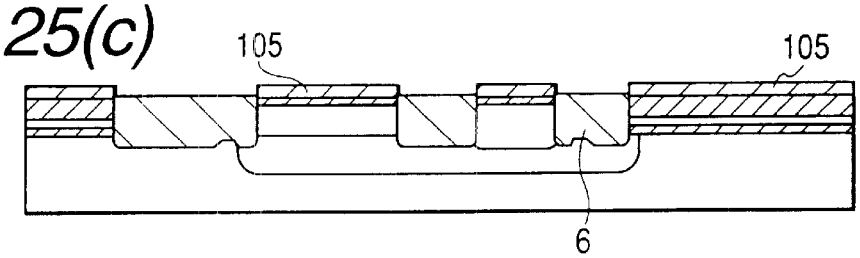
Figure 25D:
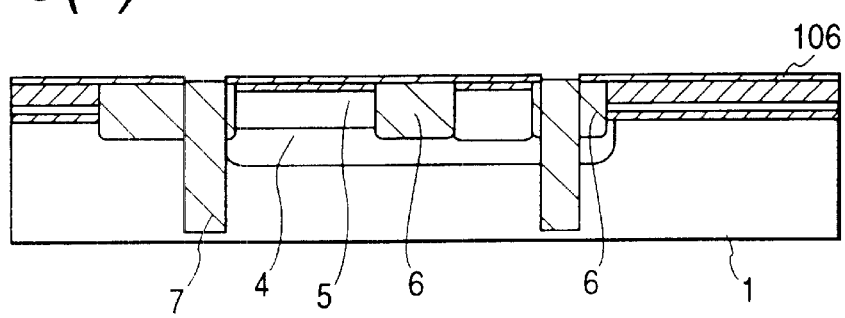
Figure 25E:
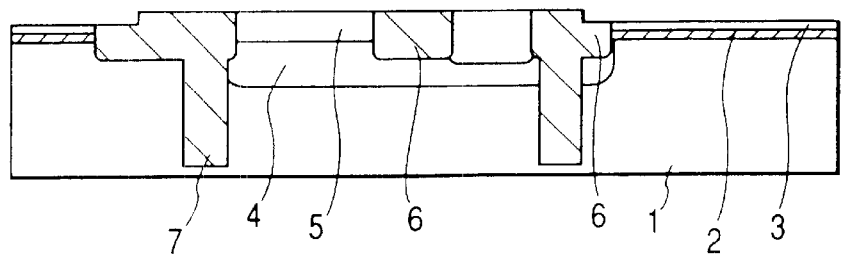
Figure 26A:
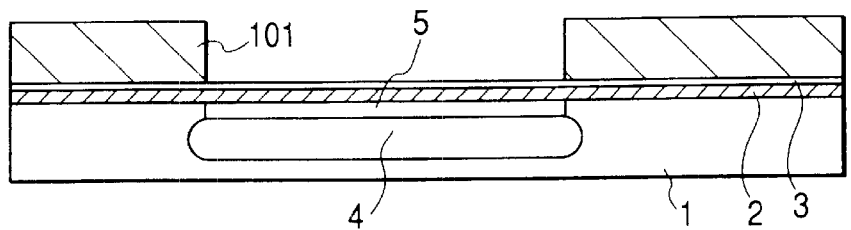
FIGS. 26(a) to 26(e) are cross-sectional views illustrating each of the main steps of the fabrication process of the BiCMOS device according to Embodiment 5 or 6 of the present invention.
Figure 26B:
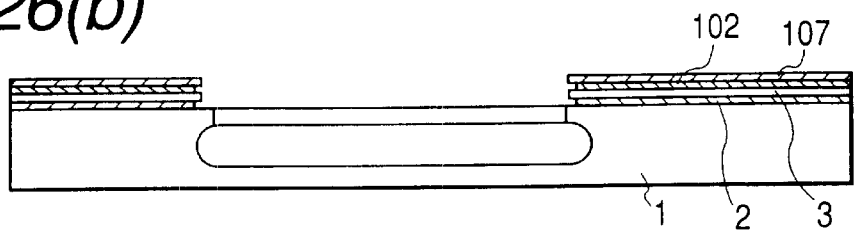
Figure 26C:
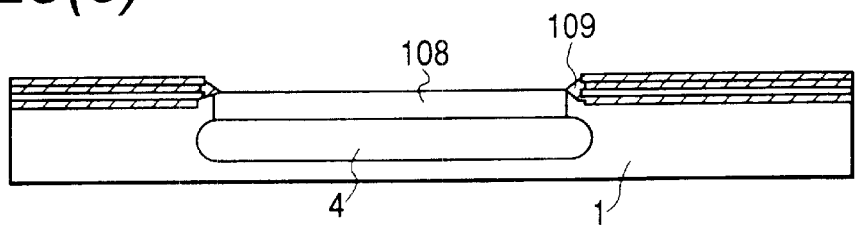
Figure 26D:
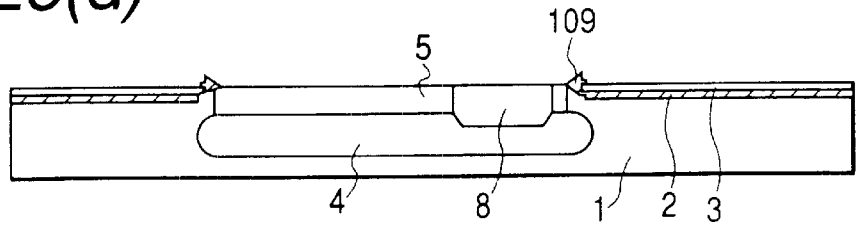
Figure 26E:
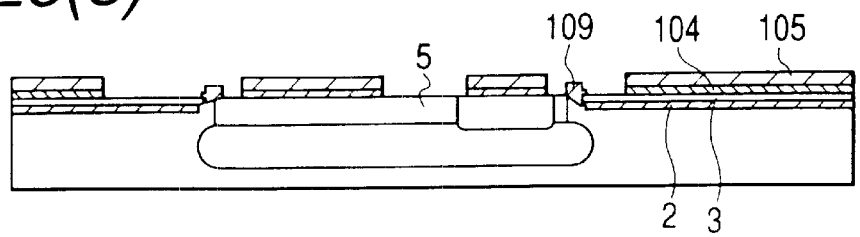
Figure 27A:
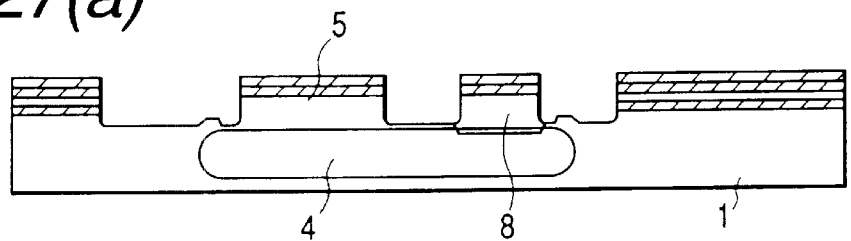
FIGS. 27(a) to 27(d) are cross-sectional views illustrating each of the main steps of the fabrication process of the BiCMOS device according to Embodiment 5 or 6 of the present invention.
Figure 27B:
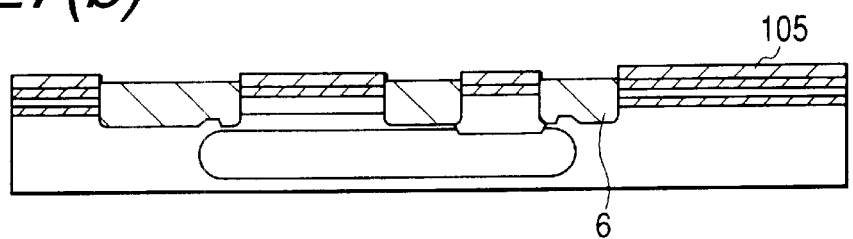
Figure 27C:
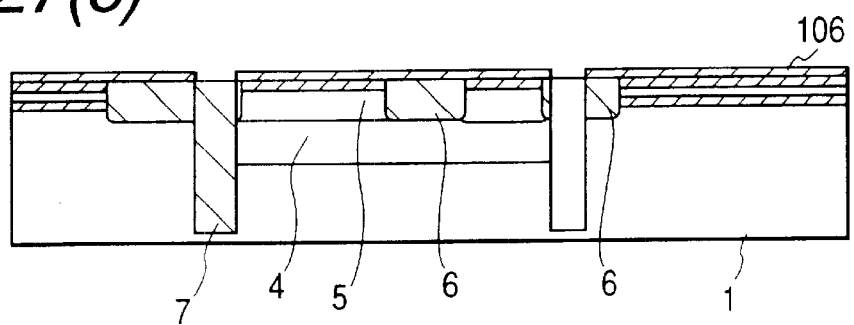
Figure 27D:
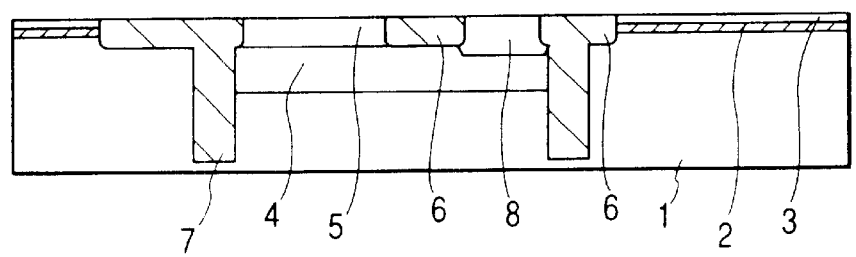

A trench 7 having an SiO₂ film embedded therein is then formed by the process of the first embodiment as illustrated in FIGS. 18(a) and 18(b) (FIG. 25(d)). The insulating film is removed to expose the SOI layer 3 and n⁻type single crystal Si layer 5 (FIG. 25(e)). Steps subsequent thereto are carried out in a similar manner to the first embodiment as illustrated in FIGS. 19(a) and 19(b).

According to the fourth embodiment, the above-described problems can be overcome. Even if the (SOI layer+BOX layer) is as thin as 0.35 μm or less, or the SOI layer is as thin as 0.15 μm or less, a vertical bipolar transistor having high breakdown voltage and low parasitic capacitance can be allowed to coexist with SOIMOSFET.

Embodiment 5

Figure 5:
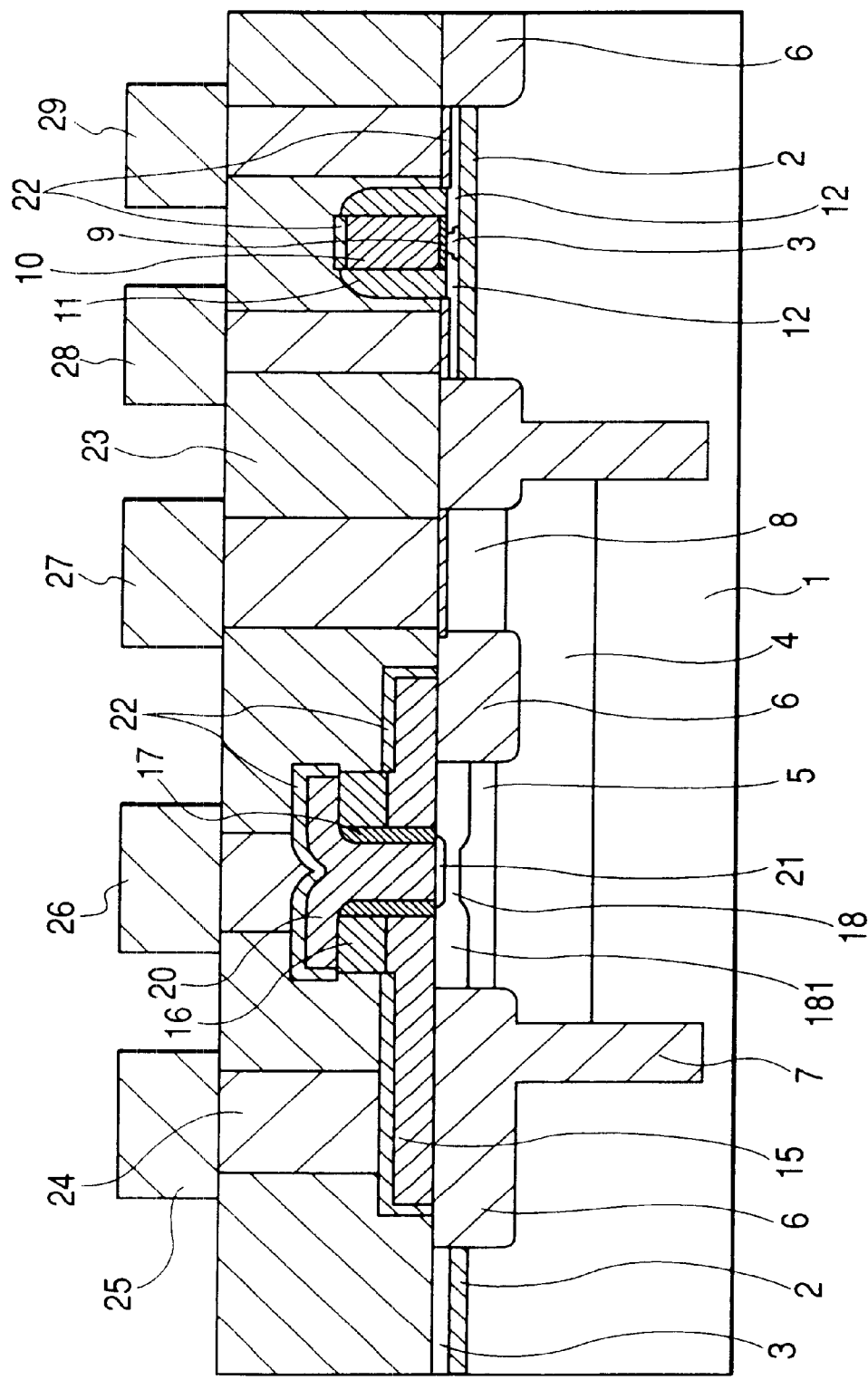
FIG. 5 is a cross-sectional view illustrating a BiCMOS device according to Embodiment 5 of the present invention.

The fifth embodiment of the present invention will be described hereinafter based on FIG. 5. FIG. 5 illustrates the longitudinal cross-sectional structure of the BiCMOS device according to the fifth embodiment of the present invention. In this diagram, like reference numerals indicate like members or like sites in FIG. 1. Indicated at reference numeral 4 is a buried collector layer for bipolar transistor, 5 a low-doped collector layer, 18 a base layer and 21 an emitter diffusion layer.

Figure 15:
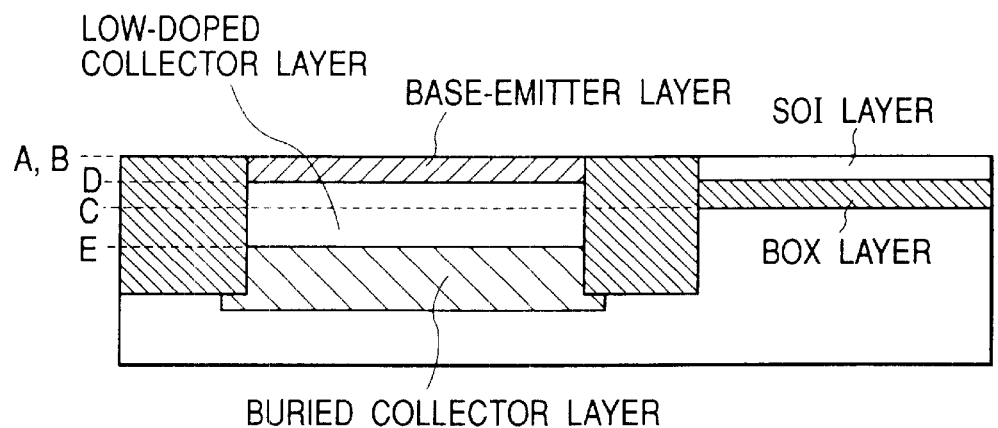
FIG. 15 is a schematic cross-sectional view illustrating the BiCMOS device according to Embodiment 3 of the present invention.

In this embodiment 5, the positional relationship among the surface (height position A) of the SOI layer, the surface (B) of the bulk structure region, the lower surface (C) of the BOX layer, and upper surface (D) and lower surface (E) of the low-doped collector layer of the bipolar transistor is identical to that shown in FIG. 15. Described specifically, the height position (B) of surface of the bulk structure region is identical to the surface (A) of the SOI layer. The total thickness of the (BOX layer and SOI layer) is 0.25 μm. The upper surface (D) and lower surface (E) of the low-doped collector layer are about 0.15 μm and about 0.25 μm lower than the lower surface (C) of the BOX layer, respectively. The thickness of the low-doped collector layer 5 is about 0.4 μm.

In the next place, the fabrication process of the BiCMOS device of the fifth embodiment will be described based on FIGS. 26(a) to 26(e) and FIGS. 27(a) to 27(d). These diagrams each illustrates the vertical npn bipolar transistor and n type MOS transistor in the main fabrication step.

First, a buried SiO₂ film (BOX layer) 2 and SOI layer 3 are formed over the p type bulk substrate 1 by the SIMOX method. While a portion to be the SOI structure region is covered with a photoresist 101 of 2 μm thick, phosphorus ions (P⁺) are implanted into the bulk Si substrate at an accelerating energy of 500 keV by ion implantation. By heating, an n⁺ type Si layer 4 is then formed (FIG. 26(a)). In this case, implantation conditions are set so that the total thickness of the (BOX layer and SOI layer) will be 0.25 μm.

An SiO₂ film 102 and Si₃N₄ film 107 are then deposited by CVD. The Si₃N₄ film 107, SiO₂ film 102, SOI layer 3 and SiO, layer 2 on the n⁺ type Si layer 4, are selectively removed by dry etching and wet etching, whereby the bulk Si substrate 1 is exposed (FIG. 26(b)).

By CVD, an n⁻type single crystal Si layer 108 is selectively grown on the bulk Si substrate 1. The growth of the film thickness is adjusted so that the surface height of the n⁻type single crystal Si layer 108 becomes almost equal to that of the SOI layer. In this case, single crystal Si 109 grows in the SOI layer exposed on the side walls of the opening portion (FIG. 26(c)).

Phosphorus ions (P⁺) are then selectively implanted at an accelerating energy of 100 keV into a part of the n⁻type single crystal Si layer 108, whereby an n⁺ type Si layer 8 is formed. Then, by wet etching, the Si₃N₄ film 107 and an SiO₂ film 102 are removed. The n⁺ type Si layer 4 will be a buried collector layer, while the n⁻type single crystal Si layer 108 will be a low-doped collector layer 5 (FIG. 26(d)).

By CVD, an SiO₂ film 104 and Si₃N₄ film 105 are deposited. These films are selectively removed from a region other than portions which will be active areas of the bipolar transistor and MOS transistor by photolithography and dry etching (FIG. 26(e)).

The SOI layer 3, single crystal Si film 109 and BOX layer 2 in the same region are selectively removed. The P⁻type bulk Si substrate exposed by dry etching is dug downwards by about 0.2 μm (FIG. 26(f)). Steps subsequent thereto as illustrated in FIGS. 27(a) to 27(d) are carried out in a similar manner to that of the third embodiment described based on FIGS. 23(b) to 23(e). Steps subsequent thereto are carried out in a similar manner to that of the first embodiment as illustrated in FIGS. 19(a) and 19(b).

According to this fifth embodiment, the above-described problems can be overcome. Even if the (SOI layer+BOX layer) is as thin as 0.35 μm or less, or the SOI layer is as thin as 0.15 μm or less, a vertical bipolar transistor having high breakdown voltage and low parasitic capacitance can be allowed to coexist with SOIMOSFET on one semiconductor substrate.

Only by changing the ion implantation energy for the formation of the n⁺ type Si layer 4 between bipolar transistors on the same chip, the bipolar transistor of the second embodiment and that of the fifth embodiment can be integrated in one chip. In other words, this embodiment facilitates easy integration of two bipolar transistors, which are different in breakdown voltage and operation rate and therefore different in role, in one chip, thereby making it possible to guarantee more freedom in designing of an LSI circuit.

Embodiment 6

Figure 6:
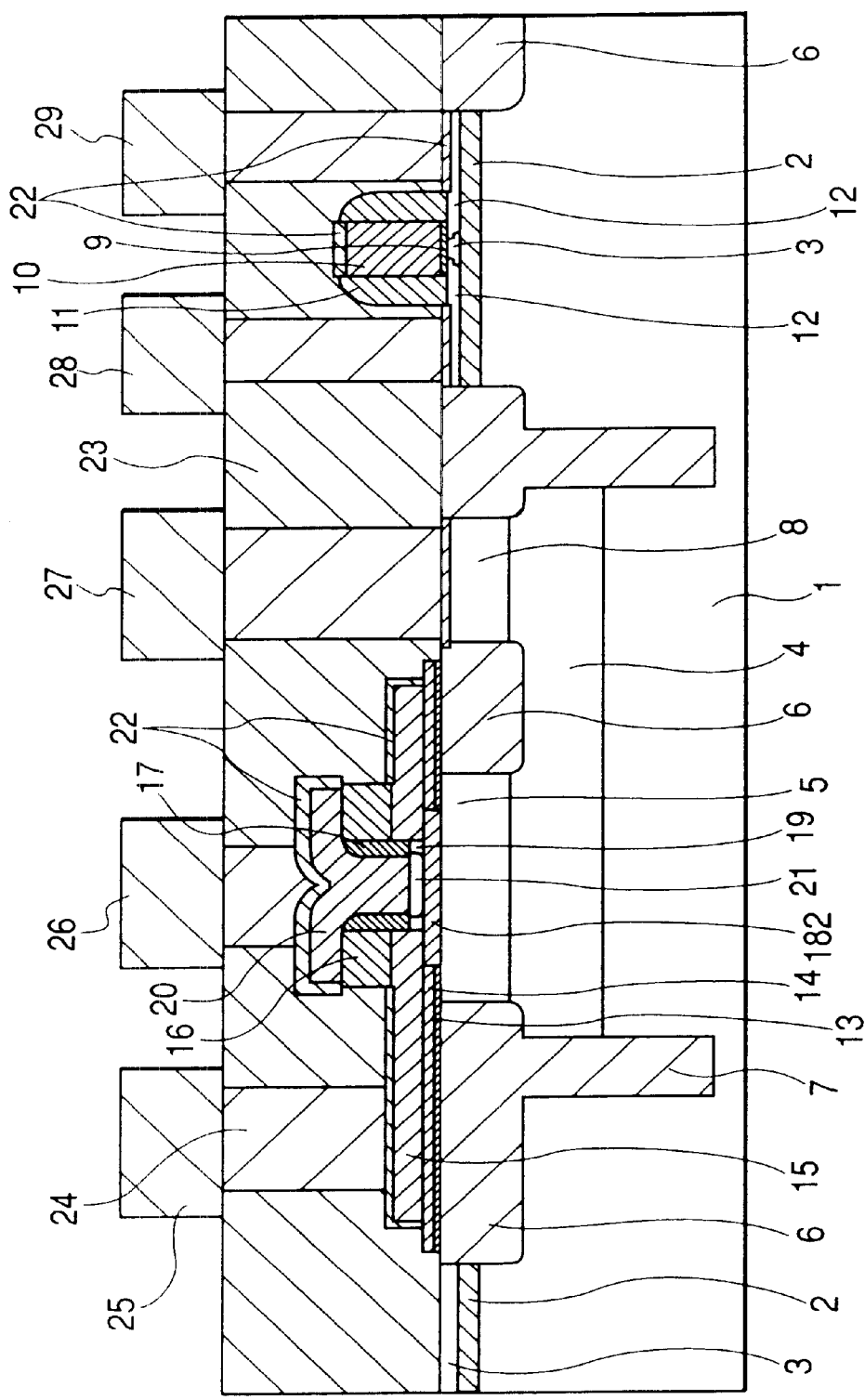
FIG. 6 is a cross-sectional view illustrating a BiCMOS device according to Embodiment 6 of the present invention.

The sixth embodiment of the present invention will be described hereinafter based on FIG. 6. FIG. 6 illustrates the longitudinal cross-sectional structure of the BiCMOS device according to the sixth embodiment of the present invention. In this diagram, like reference numerals indicate like members or like sites in FIG. 2. Indicated at reference numeral 4 is a buried collector layer for bipolar transistor, 5 a low-doped collector layer, 182 a base layer and 21 an emitter diffusion layer. Between the low-doped collector layer 5 and p type SiGe alloy layer as the base layer 182, a non-doped SiGe alloy layer having a thickness of about 10 nm (nanometer) to 50 (nanometer) may be inserted.

Figure 16:
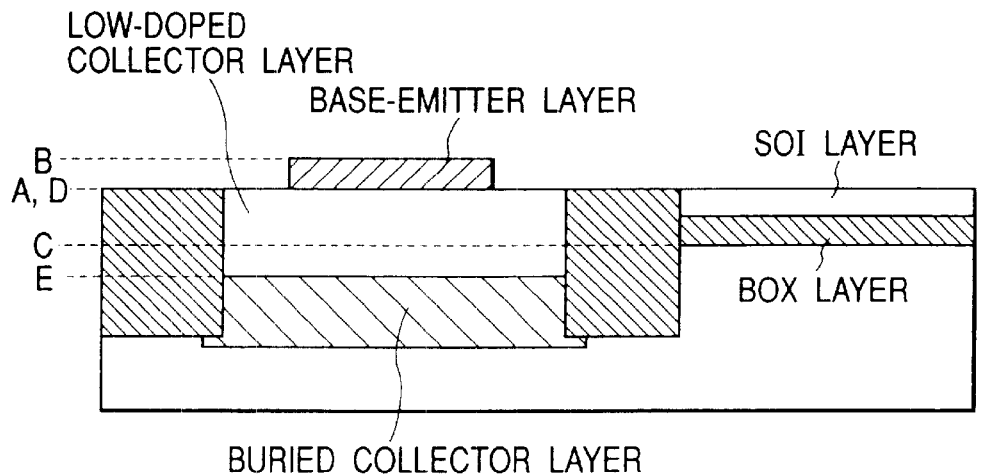
FIG. 16 is a schematic cross-sectional view illustrating the BiCMOS device according to Embodiment 6 of the present invention.
Figure 17A:
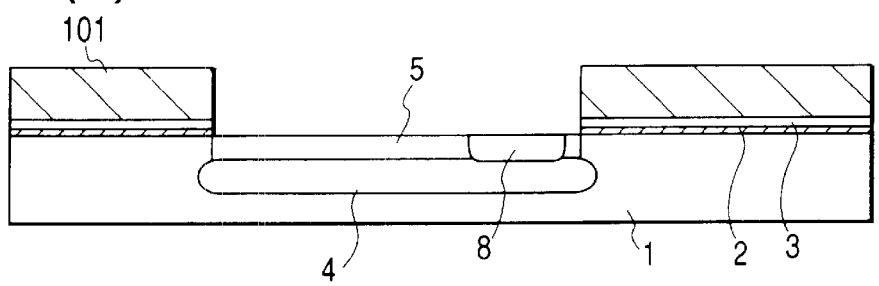
FIGS. 17(a) to 17(e) are cross-sectional views illustrating each of the main steps of the fabrication process of the BiCMOS device according to Embodiment 1 of the present invention.
Figure 17B:
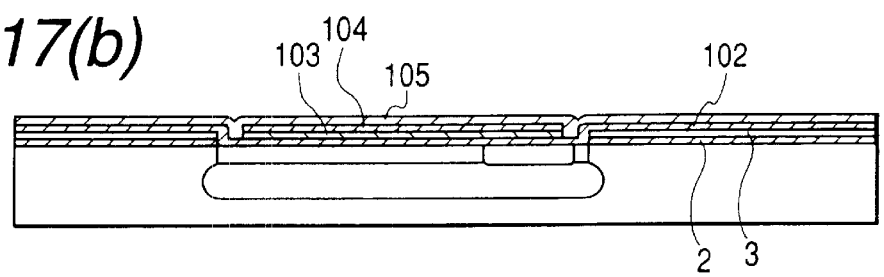
Figure 17C:
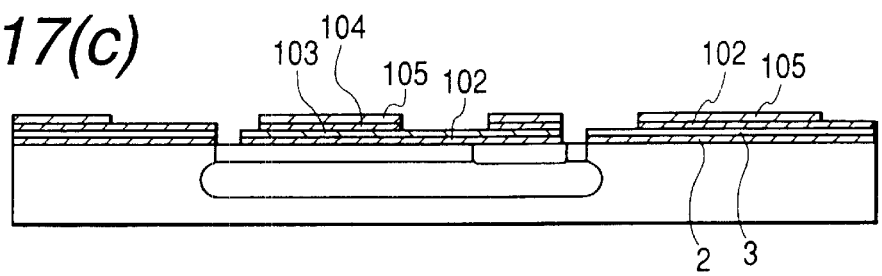
Figure 17D:
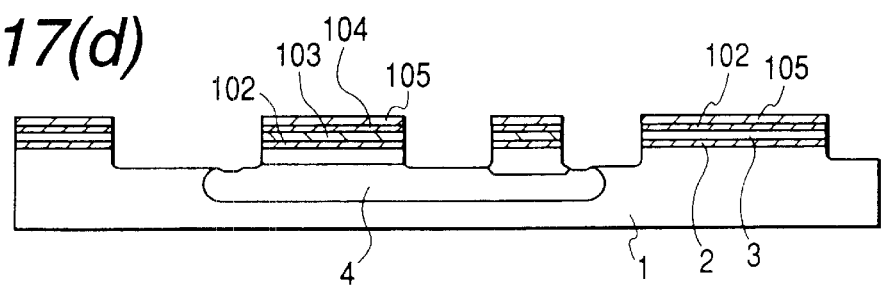
Figure 17E:
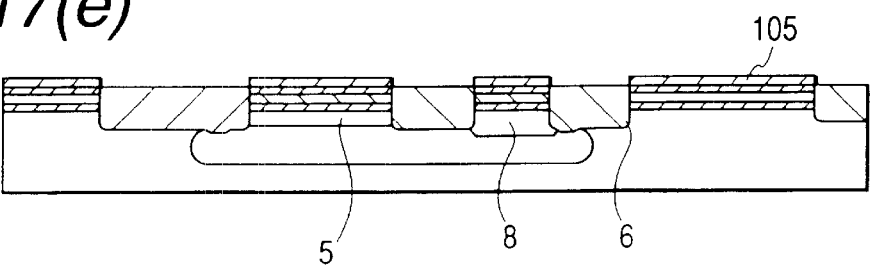

In this Embodiment 6, the positional relationship among the surface (height position A) of the SOI layer, the surface (B) of the bulk structure region, the lower surface (C) of the BOX layer, and upper surface (D) and lower surface (E) of the low-doped collector layer of the bipolar transistor is identical to that shown in FIG. 16. Described specifically, the height position (D) of the upper surface of the low-doped collector layer 5 is identical to the surface (A) of the SOI layer. The total thickness of the (BOX layer and SOI layer) is 0.25 Mm. The lower surface (E) of the low-doped collector layer 5 is about 0.25 μm lower than the lower surface (C) of the BOX layer. The thickness of the low-doped collector layer 5 is set at about 0.5 μm.

In the next place, the fabrication process of the BiCMOS device of the sixth embodiment will be described. Steps prior to the formation of the base and emitter layers in this embodiment are carried out in a similar manner to that of the fifth embodiment described based on FIGS. 26(a) to 26(e) and FIGS. 27(a) to 27(d). Steps subsequent thereto are carried out in a similar manner to that of the second embodiment of the present invention described based on FIGS. 21(a) to 21(c).

According to the sixth embodiment, the above-described problems can be overcome. Even if the (SOI layer+BOX layer) is as thin as 0.35 μm or less, or the SOI layer is as thin as 0.15 μm or less, a vertical bipolar transistor having high breakdown voltage and low parasitic capacitance can be allowed to coexist with SOIMOSFET on one semiconductor substrate.

Only by changing, between bipolar transistors on the same chip, the ion implantation energy for the formation of the n⁺ type Si layer 4, the bipolar transistor of the third embodiment and that of the sixth embodiment can be integrated in one chip. In other words, this embodiment facilitates integration of two bipolar transistors, which are different in breakdown voltage and operation speed and therefore different in role, in one chip, thereby making it possible to guarantee more freedom in designing of a circuit.

Embodiment 7

Figure 28:
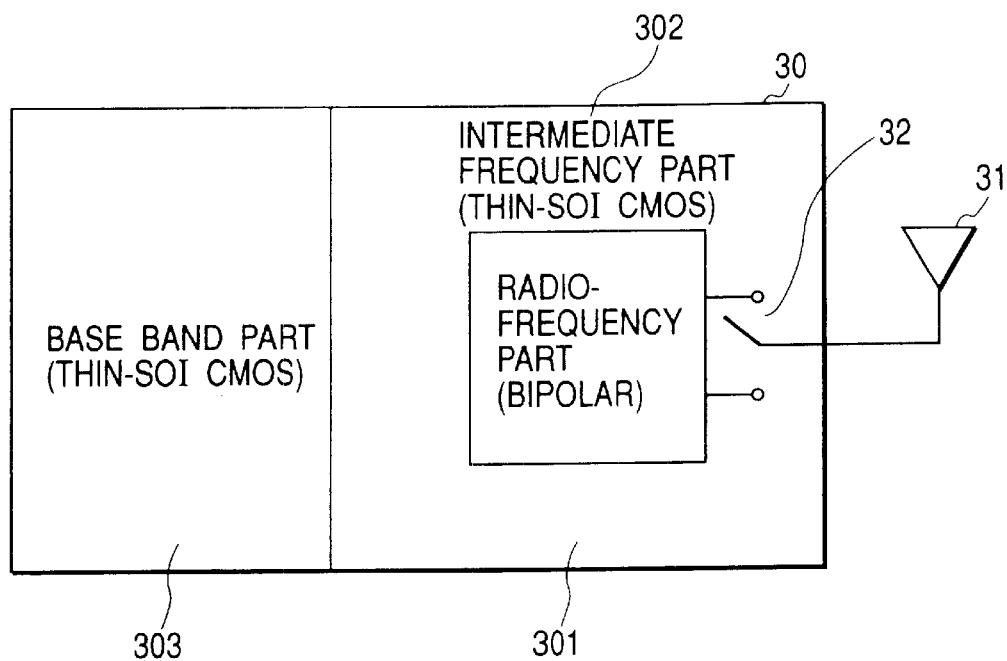
FIG. 28 is a block diagram illustrating the main portion of a broadband wireless communication system to which the BiCMOS integrated circuit device of the present invention has been applied.

FIG. 28 is a block diagram illustrating the main portion of a broadband wireless communication system to which the BiCMOS integrated circuit device of the present invention has been applied. In this diagram, indicated at reference numeral 30 is an LSI for broadband wireless communication system, 31 an antenna and 32 a send-receive change-over switch. The circuit in the LSI 30 for broadband wireless communication system has three portions according to the signal frequency to be treated, that is, radio-frequency part 301, intermediate-frequency part 302 and base band part 303. The bipolar transistor relating to the present invention is mainly employed in the radio-frequency part 301, while the thin-layer SOI-CMOS relating to the present invention is mainly employed in the intermediate-frequency part 302 and baseband part 303, which facilitates high speed operation of a broadband wireless communication system.

Embodiment 8

Figure 29:
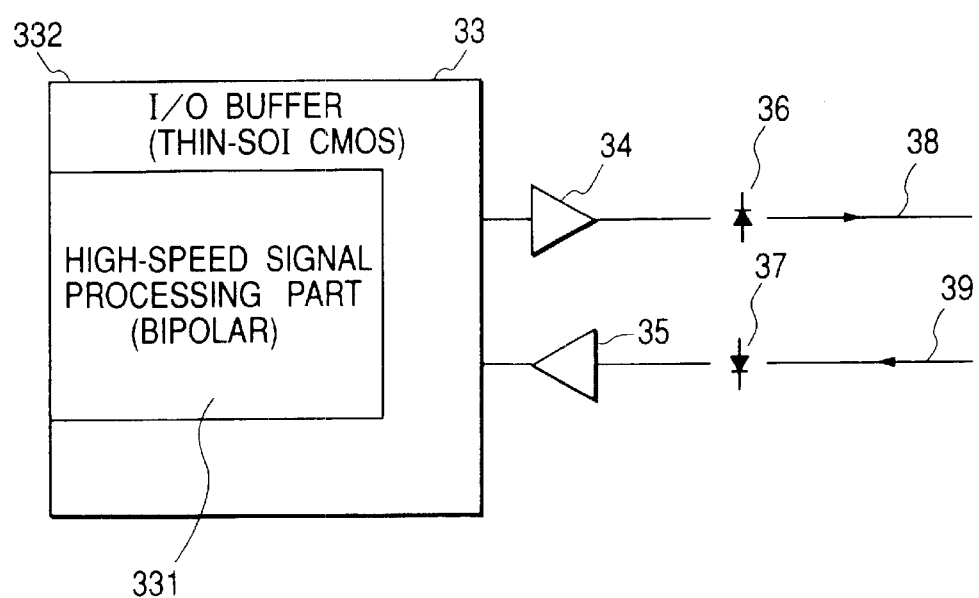
FIG. 29 is a block diagram illustrating the main portion of a high-speed optical network system to which the BiCMOS integrated circuit device of the present invention has been applied.

FIG. 29 is a block diagram illustrating the main portion of a high-speed optical network system to which the BiCMOS integrated circuit device of the present invention has been applied. Indicated at reference numeral 33 is an LSI for high-speed optical network system, 34 a laser driver, 35 a preamplifier, 36 a semiconductor laser, 37 a photo diode, and 38,39 optical fibers. The circuit in the LSI 33 for high-speed optical network system has two portions, that is, high-speed signal processing part 332 and input and output (I/O) buffer part 332. The bipolar transistor relating to the present invention is mainly employed in the high-speed signal processing part 332, while the thin-layer SOI-CMOS relating to the present invention is employed in the input/output (I/O) buffer part 332, which facilitates high speed operation of an optical network system.

What is claimed is:

1. A process for fabricating a semiconductor integrated circuit device, which comprises preparing a semiconductor wafer having an insulating layer embedded in a semiconductor region and a semiconductor layer deposited on said insulating layer, partially removing said semiconductor layer and said insulating layer therebelow to expose said semiconductor region below said semiconductor layer and said insulating layer, forming a buried highly-doped collector layer for a vertical bipolar transistor by ion implantation inside of said exposed semiconductor region, forming at least a part of a low-doped collector layer at a site inside of said semiconductor layer and over said buried highly-doped collector layer, and forming a base layer and an emitter layer each at the surface portion of said low-doped collector layer.

2. A process for fabricating a semiconductor integrated circuit device according to claim 1, wherein after the formation of the low-doped collector layer, source/drain regions of an insulated gate transistor are formed in the remaining portion of said semiconductor layer.

3. A process for fabricating a semiconductor integrated circuit device, which comprises preparing a semiconductor wafer having an insulating layer embedded in a semiconductor region and a semiconductor layer deposited on said insulating layer, partially forming a buried highly-doped collector layer by ion implantation, through said semiconductor layer and said insulating layer therebelow, inside of said semiconductor region below said semiconductor layer and said insulating layer, removing said semiconductor layer and said insulating layer on said buried highly-doped collector layer, forming a low-doped collector layer over said highly-doped collector layer, and forming a base layer and an emitter layer each at the surface portion of said low-doped collector layer.

* * * * *